United States Patent
Uchiyama

(10) Patent No.: US 10,896,875 B2
(45) Date of Patent: Jan. 19, 2021

(54) FORMING CONDUCTIVE PLUGS FOR MEMORY DEVICE

(71) Applicant: MICRON TECHNOLOGY, INC., Boise, ID (US)

(72) Inventor: Shiro Uchiyama, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/590,039

(22) Filed: Oct. 1, 2019

(65) Prior Publication Data
US 2020/0035597 A1 Jan. 30, 2020

Related U.S. Application Data

(60) Continuation of application No. 16/000,697, filed on Jun. 5, 2018, now Pat. No. 10,438,888, which is a division of application No. 15/418,568, filed on Jan. 27, 2017, now Pat. No. 9,997,452.

(51) Int. Cl.
| | |
|---|---|
| *H01L 23/522* | (2006.01) |
| *H01L 21/762* | (2006.01) |
| *H01L 23/528* | (2006.01) |
| *H01L 29/06* | (2006.01) |
| *H01L 21/768* | (2006.01) |
| *H01L 27/108* | (2006.01) |

(52) U.S. Cl.
CPC ........ *H01L 23/5226* (2013.01); *H01L 21/762* (2013.01); *H01L 21/76229* (2013.01); *H01L 21/76897* (2013.01); *H01L 21/76898* (2013.01); *H01L 23/528* (2013.01); *H01L 27/10844* (2013.01); *H01L 27/10897* (2013.01); *H01L 29/0649* (2013.01); *H01L 27/10802* (2013.01)

(58) Field of Classification Search
CPC .............. H01L 21/762–76297; H01L 23/5226
See application file for complete search history.

(56) References Cited

U.S. PATENT DOCUMENTS

| | | | |
|---|---|---|---|
| 9,997,452 B1 | 6/2018 | Uchiyama | |
| 2012/0306084 A1 | 12/2012 | Wood et al. | |
| 2013/0140700 A1 | 6/2013 | Ohmi | |
| 2013/0157436 A1 | 6/2013 | Hummler | |
| 2016/0020145 A1* | 1/2016 | Lee | H01L 21/3083 438/400 |
| 2018/0301408 A1 | 10/2018 | Uchiyama | |

FOREIGN PATENT DOCUMENTS

| | | |
|---|---|---|
| JP | 2009-111061 A | 5/2009 |
| JP | 2013-074263 A | 4/2013 |
| JP | 2013-247139 A | 12/2013 |

* cited by examiner

*Primary Examiner* — Daniel P Shook
(74) *Attorney, Agent, or Firm* — Dorsey & Whitney LLP

(57) ABSTRACT

Apparatuses and methods with conductive plugs for a memory device are described. An example method includes: forming a plurality of shallow trench isolations elongating from a first surface of a semiconductor substrate toward a second surface of the semiconductor substrate; thinning the semiconductor substrate until first surfaces of the plurality of shallow trench isolations are exposed; forming a plurality of via holes, each via hole of the plurality of via holes through a corresponding one of the plurality of shallow trench isolations; and filling the plurality of via holes with a conductive material to form a plurality of conductive plugs.

21 Claims, 17 Drawing Sheets

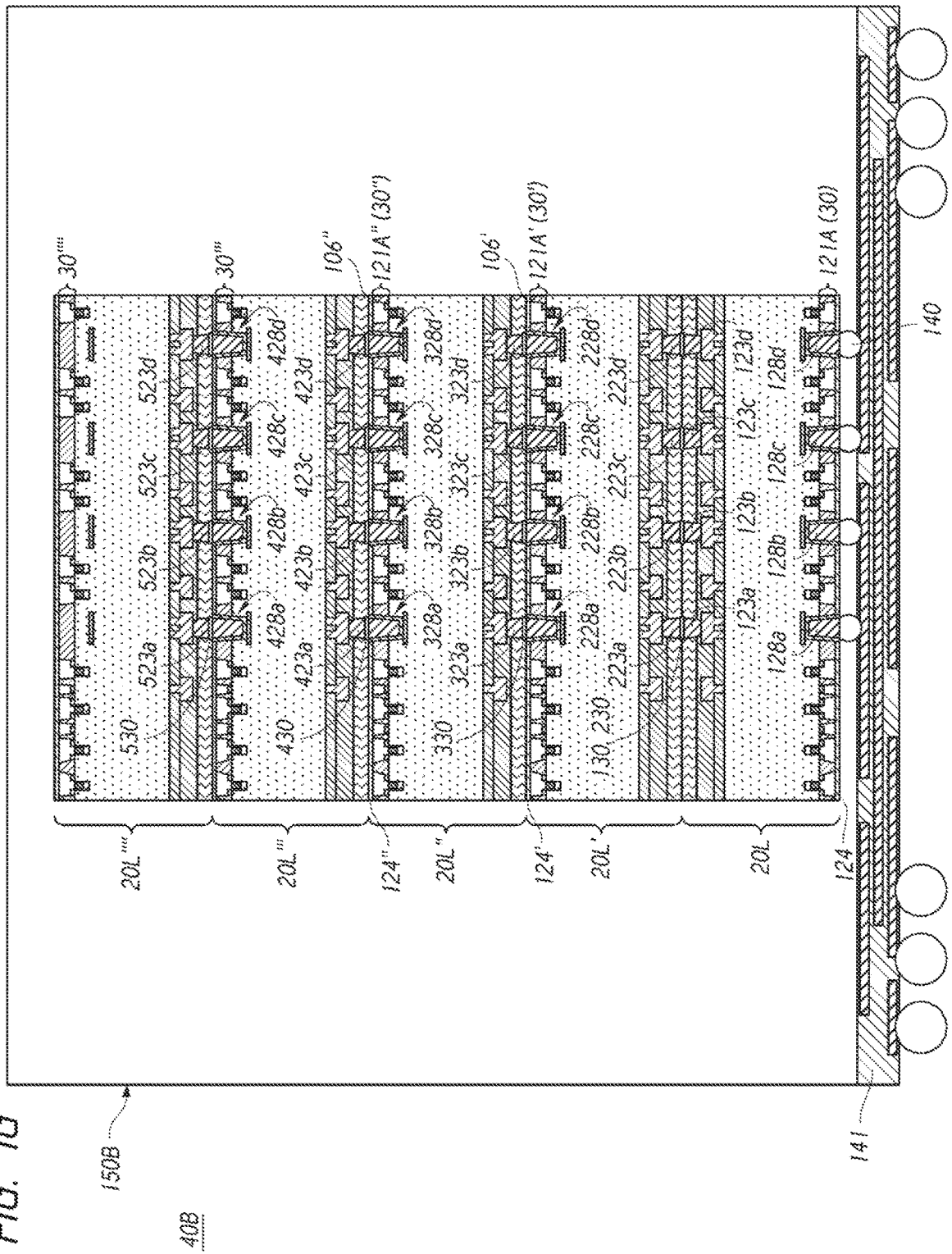

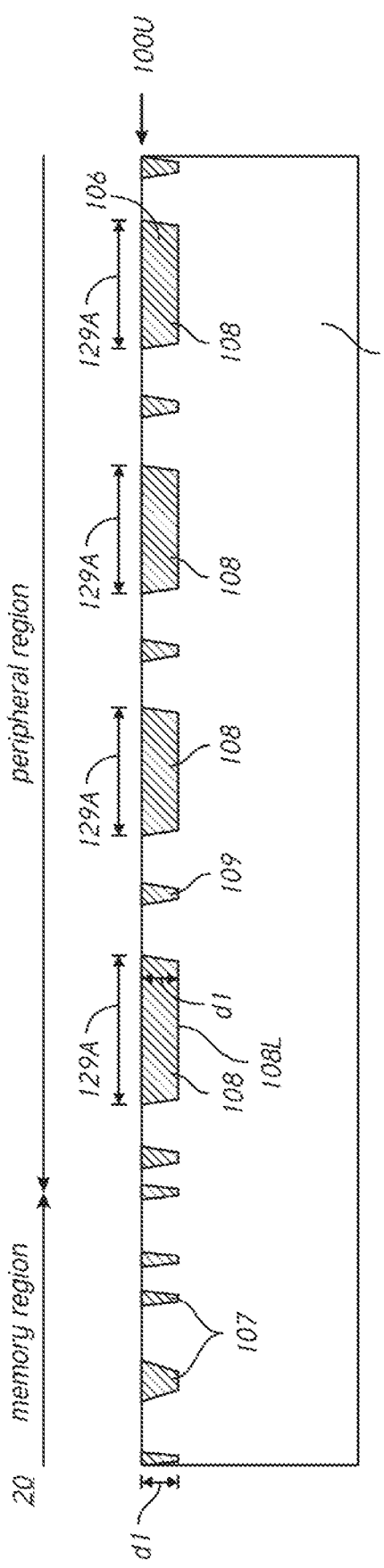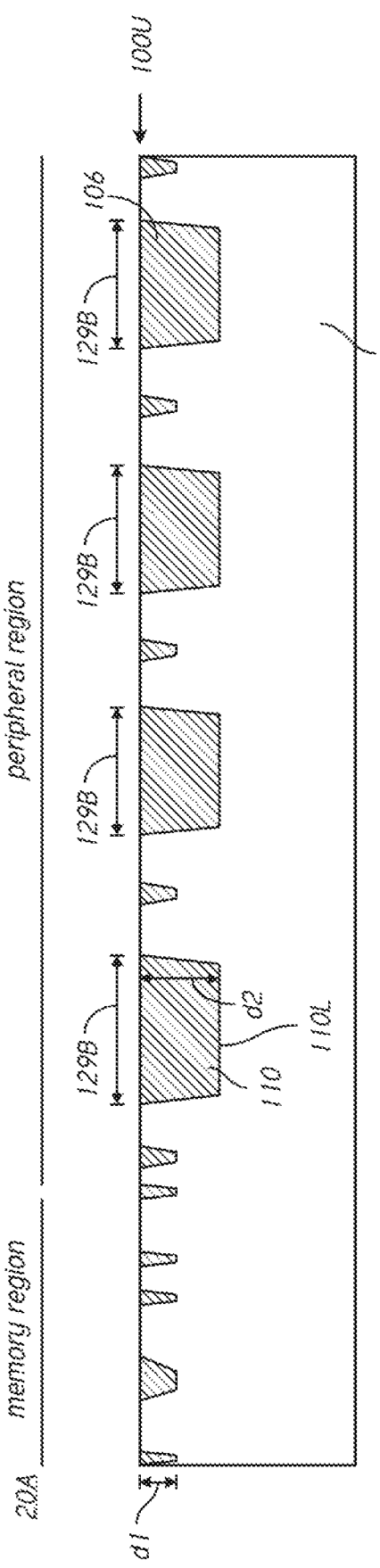

FORMING CONDUCTIVE PLUGS FOR MEMORY DEVICE

CROSS-REFERENCE TO RELATED APPLICATION(S)

This application is a continuation of U.S. patent application Ser. No. 16/000,697, filed Jun. 5, 2018, which is a divisional of U.S. patent application Ser. No. 15/418,568, filed Jan. 27, 2017 and issued as U.S. Pat. No. 9,997,452 on Jun. 12, 2018. The aforementioned applications are incorporated by reference herein, in its entirety, and for any purposes.

BACKGROUND

High data reliability, high speed of memory access, lower power consumption and reduced chip size are features that are demanded from semiconductor memory. In recent years, three-dimensional (3D) memory devices by stacking laminated semiconductor chips vertically stacked and interconnecting the semiconductor chips using through-silicon vias (TSVs) have been introduced. Benefits of the 3D memory devices include a plurality of chips stacked with a large number of vertical vias between the plurality of chips and the memory controller, which allow wide bandwidth buses with high transfer rates between functional blocks in the plurality of chips and a considerably smaller footprint. Thus, the 3D memory devices contribute to large memory capacity, higher memory access speed and chip size reduction. The 3D memory devices include Hybrid Memory Cube (HMC) and High Bandwidth Memory (HBM).

The TSVs are through electrodes that penetrate a semiconductor chip including a semiconductor substrate typically composed of silicon. A parasitic capacitance is caused in each TSV when a signal through the semiconductor substrate, due to a ground potential of the semiconductor substrate surrounding the through electrode and poor isolation between the semiconductor substrate and the TSV. Furthermore, forming a stacked chip package including a large number (e.g., several tens to several hundreds) of semiconductor chips stacked on one another typically requires high precision of processing due to a length of the TSV (e.g., 30 µm to 50 µm) relative to a thickness of the semiconductor chip.

BRIEF DESCRIPTION OF THE DRAWINGS

FIG. 1G is a schematic diagram of conductive plugs in stacked chips of a semiconductor device, in accordance with an embodiment of the present disclosure.

FIG. 4A is a schematic diagram of a portion of a chip in a semiconductor device, in accordance with an embodiment of the present disclosure.

FIG. 4B is a schematic diagram of a portion of a chip in a semiconductor device, in accordance with an embodiment of the present disclosure.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1B:
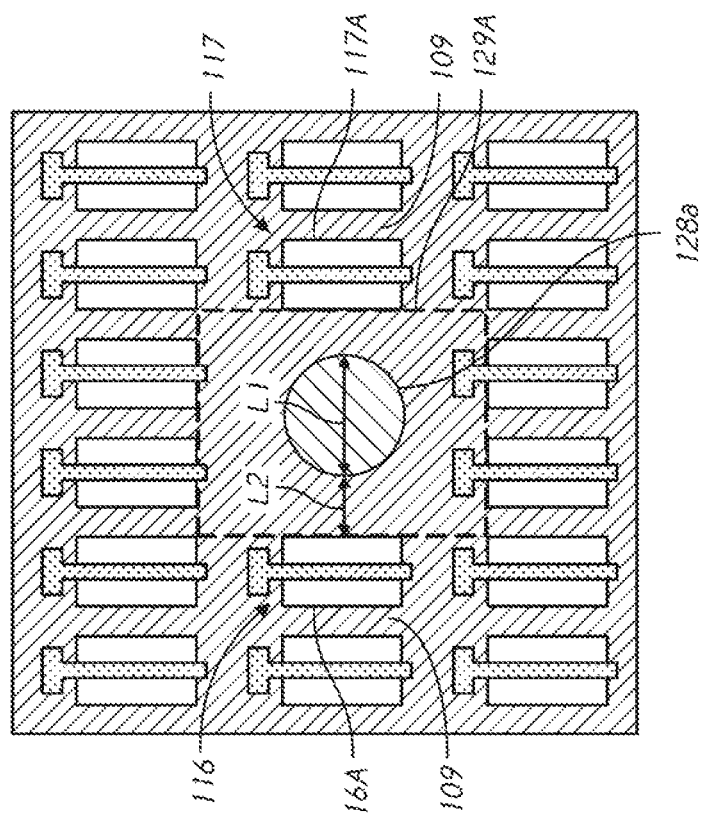
FIG. 1B is a simplified layout diagram of a conductive plug in a chip, in accordance with an embodiment of the present disclosure.
Figure 1A:
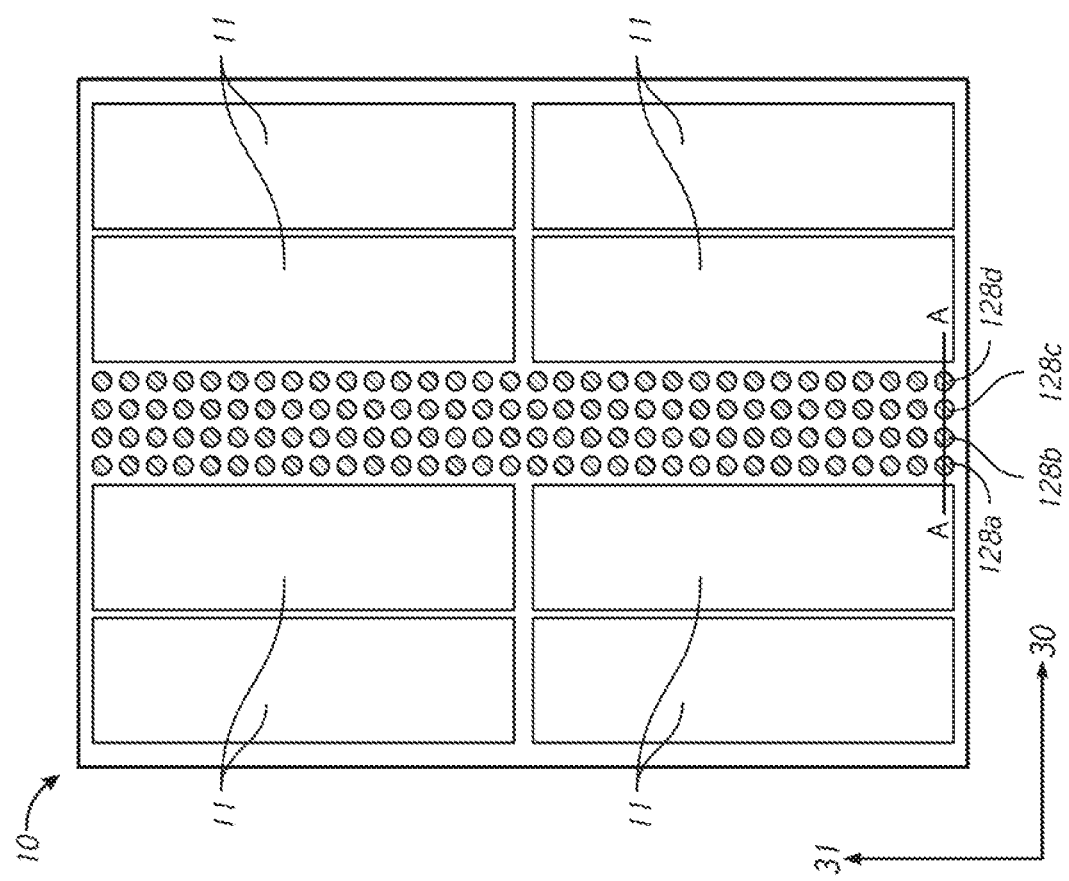
FIG. 1A is a simplified layout diagram of a chip including conductive plugs in a semiconductor device, in accordance with an embodiment of the present disclosure.

FIG. 1A is a simplified layout diagram of a chip 10 including conductive plugs in a semiconductor device, in accordance with an embodiment of the present disclosure. For example, the chip 10 may be in a rectangular shape. For example, the chip 10 may include at least one memory cell region including a plurality of memory mats 1 (e.g., eight memory mats) and a peripheral region including a peripheral circuit disposed around the memory cell region. For example, the chip 10 may include two memory cell regions and a peripheral region at the center of the chip 10. In this example, the peripheral region may be between the memory mats 11 and aligned to the memory mats 11 along a first direction 30. The peripheral region may extend in a second direction 31 perpendicular to the first direction 30. Each memory mat 11 may include a plurality of memory cells. A plurality of conductive plugs 128a, 128b, 128c and 128d may be included in the peripheral region. For example, the conductive plugs 128a, 128b, 128c and 128d may be disposed in a grid pattern in the peripheral region. For example, the conductive plugs 128a, 128b, 128c and 128d may be through-dielectric vias (TDV) (e.g., through-dielectric conductors).

FIG. 1B is a simplified layout diagram of a conductive plug 128a in a chip 10, in accordance with an embodiment of the present disclosure. For example, the peripheral region around the conductive plug 128a may include a TDV region 129A that includes the conductive plug 128a. The peripheral region may include a plurality of peripheral device regions 116A, 117A, and a peripheral shallow trench isolation (STI) region 109 surrounding the plurality of peripheral device regions 116A, 117A. The TDV region 129A may be a portion of the peripheral STI region 109. For example, the peripheral STI region 109 located in the center may be partitioned as the TDV region 129A. For example, the TDV region 129A may have a greater width than a width of other peripheral STI regions 109. For example, a length of a side of the TDV region 129A may be approximately in a range from 1 μm to 4 μm whereas a length of a side of each of the other peripheral STI regions 109 may be approximately in a range from 0.02 μm to 0.1 μm. For example, the TDV region 129A may have an area larger than an area of the other peripheral STI region 109 by at least ten times or more. The plurality of peripheral device regions 116A and 117A may include a first peripheral device region 116A and a second peripheral device region 117A that are adjacent to the TDV region 129A. In the peripheral device regions 116A and 117A, a first peripheral transistor 116 and a second peripheral transistor 117 may be disposed, respectively. The TDV region 129A may be defined by a partition (as shown in a thick dotted line) in contact with adjacent peripheral device regions. For example, lateral sides of the TDV region 129A may be in contact with the adjacent peripheral device regions 116A and 117A. Longitudinally upper and lower sides of the TDV region 129A may be in contact with other peripheral device regions. The TDV region 129A may be the peripheral STI region between the adjacent peripheral device regions 116A and 117A, which may be made of a dielectric film. For example, a conductive plug 128a may be disposed in the TDV region 129A. For example, a cross-sectional shape of the conductive plug 128a may be a circular shape. For example, a diameter L1 of a cross section of the conductive plug 128a may be approximately 1 μm, whereas a distance L2 from an outer surface of the conductive plug 128a to an end of the TDV region 129A may have a shortest distance that is approximately in a range from 0.5 μm to 1.5 μm. For example, a cross-sectional shape of the conductive plug 128a may not be limited to the circular shape, and may be another shape (e.g., a rectangular shape).

Figure 1C:
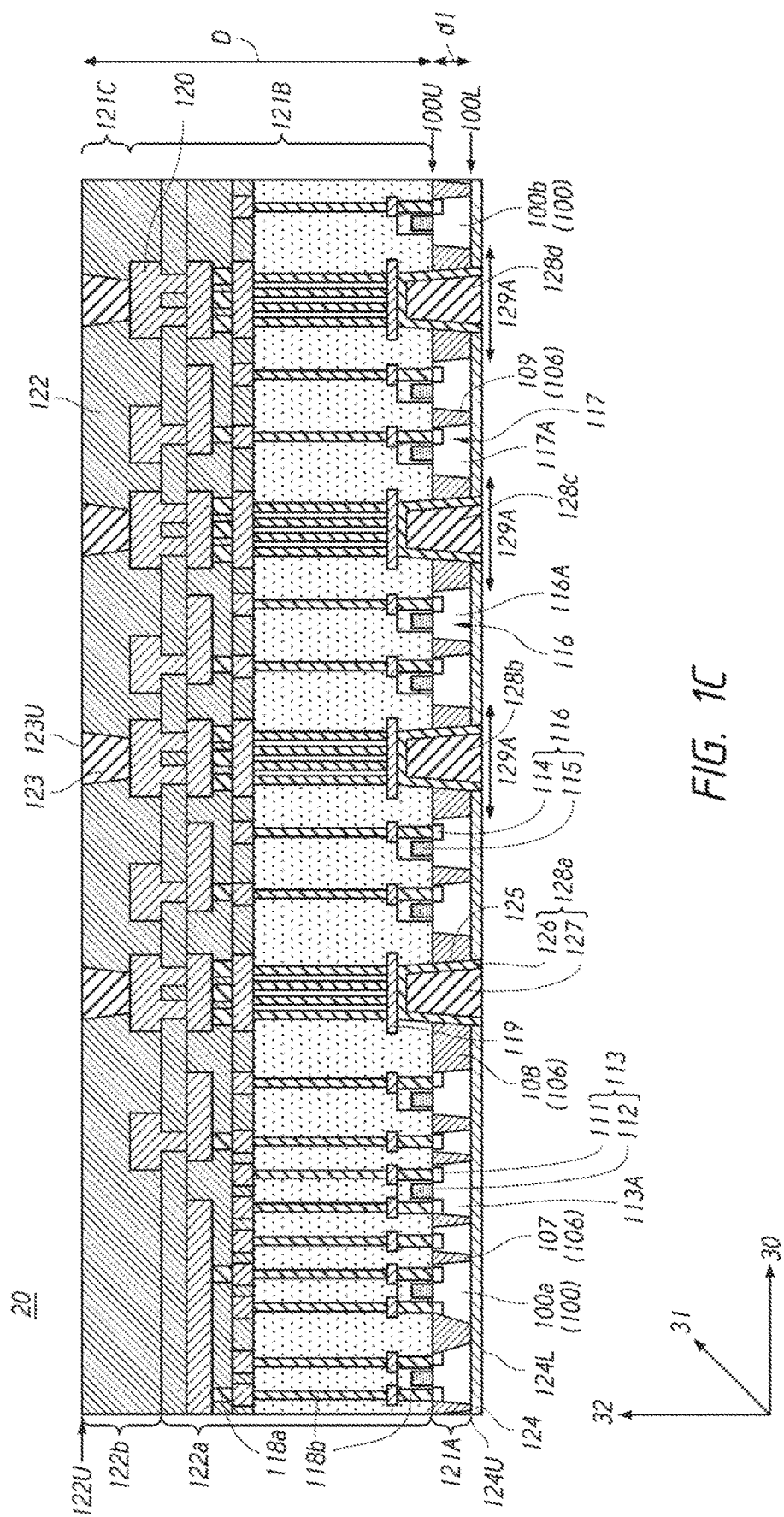
FIG. 1C is a schematic diagram of conductive plugs in a chip, in accordance with an embodiment of the present disclosure.

FIG. 1C is a schematic diagram of conductive plugs in a chip 20, in accordance with an embodiment of the present disclosure. For example, the chip 20 may be the chip 10 in FIG. 1A and FIG. 1C may be a cross-sectional view showing the chip 20 along on a line A-A' shown in FIG. 1A. That is, the cross-sectional view covers a portion of memory cell regions and the peripheral region including a plurality of conductive plugs 128a, 128b, 128c and 128d. The chip 20 may include a semiconductor layer 121A, an interconnect layer 121B and a contact bump layer 121C.

The semiconductor layer 121A may include a semiconductor substrate 100 that has an upper surface 100U and a lower surface 100L. A film 124 may be disposed as a lowermost layer of the chip 20 on the lower surface 100L of the semiconductor layer 121A. For example, the film 124 may protect a memory device region 113A and the peripheral device regions 116A and 117A made of semiconductor materials from being contaminated by metal material while forming the conductive plug 128a. The film 124 may adjust warping of an entire semiconductor device including stacked chips, which will be described later in this disclosure. For example, the film 124 may be a passivation dielectric film (e.g., a silicon oxide film, a silicon nitride film, a silicon oxynitride film, etc.). For example, a thickness of the film 124 may be in a range from 0.05 μm to 0.3 μm.

The semiconductor layer 121A may include a memory STI region 107, the memory device region 113A, a TDV-STI region 108, the peripheral STI region 109, the peripheral device regions 116A and 117A. For example, the memory device regions 113A, and the peripheral device regions 116A and 117A may be made from a semiconductor material 100a (e.g., silicon single crystal, other semiconductor materials). The STI memory region 107, the TDV-STI region 108 and the peripheral STI region 109 may be formed from a film 106. For example, the film 106 may be a STI dielectric film (e.g., a silicon oxide film, a silicon nitride film, a silicon oxynitride film, etc.). For example, a thickness "d1" of the semiconductor layer 121A in the semiconductor device 10 may be in a range from 0.2 μm to 0.35 μm. That is, the STI regions including the memory STI region 107, the TDV-STI region 108, and the peripheral STI region 109 may have the same depth that is the thickness "d1" of the semiconductor layer 121A. Bottom surfaces of the memory STI region 107, the TDV-STI region 108, and the peripheral STI region 109 may be in contact with an upper surface 124U of the film 124. The film 106 may be formed as a first dielectric film. Each device region of the memory device regions 113A, and the peripheral device regions 116A and 117A may include side faces (e.g., at two sides) in contact with adjacent STI regions from the film 106 and a bottom face in contact with the film 124. Thus, each device region of the memory device regions 113A, and the peripheral device regions 116A and 117A may have a floating-body structure. For example, a memory cell transistor 113 including a source/drain region 111 and a gate region 112 may be provided in the memory device region 113A located in the memory cell region. For example, a first peripheral transistor 116 including a source/drain region 114 and a gate region 115 may be provided in the first peripheral device region 116A. Similarly, a second peripheral transistor 117 may be provided in the second peripheral device region 117A.

The interconnect layer 121B may include a TDV pad 119 and a contact bump pad 120. The TDV pad 119 may be coupled to a conductive plug 128 (e.g., 128a, 128b, 128c, 128d) and the contact bump pad 120 may be coupled to contact bumps 123. Circuits including wiring structures may be included in a plurality of films 122a and 122b. For example, the plurality of films 122a and 122b may be interlayer dielectric films. The interlayer dielectric film 122a may include a plurality of wiring structures that may be coupled to each other through contact plugs 118a and contact vias 118b. In the memory cell region, memory elements using capacitors (not shown) may be disposed within the interconnect layer 121B. For example, the memory elements may be memory transistors 113.

The contact bump layer 121C may include contact bumps 123 coupled to the contact bump pad 120. The interlayer dielectric film 122b may include the contact bump layer 121C and the contact bump pad 120. The contact bumps 123 may be implemented using metal (e.g., copper, etc.). Upper surfaces 123U of the contact bumps 123 and an upper surface 122U of the interlayer dielectric film 122b may be on a same continuous surface.

The conductive plugs 128a to 128d may be disposed on the interconnect layer 121B on a surface in contact with the semiconductor layer 121A, opposite to another surface that is closer to the contact bump layer 121C. For example, each via may include a via hole 125 and each conductive plug of the conductive plugs 128a to 128d that may be made of metal, embedded in the via hole 125. The via hole 125 may be through a portion of the film 124, the TDV-STI region 108 in the film 106 in the TDV region 129A and the interlayer dielectric film 121B located inside the TDV region 129A. Thus, the via hole 125 may expose a rear surface of the TDV pad 119 in the interconnect layer 121B. For example, each conductive plug of the conductive plugs 128a to 128d may include a barrier portion 126 that covers an inner surface of the via hole 125 and a conductive portion 127 that is configured to fill the via hole 125 covered with the barrier portion 126. For example, the barrier portion 126 may be implemented by tantalum (Ta), tantalum nitride (TaN) or the like. For example, the conductive portion 127 may be implemented by copper (Cu) or the like. For example, the TDV-STI region 108 in the film 106 in the TDV region 129A surrounding each conductive plug of the conductive plugs 128a to 128d may insulate adjacent peripheral device regions (e.g. the first peripheral device region 116, the second peripheral device region 117, etc.) from the conductive plugs 129a to 129d. Thus, the TDV-STI region 108 may insulate semiconductor material from each conductive plug of the conductive plugs 128a and 128d. The TDV-STI region 108 and the peripheral STI region 109 may be continuous on a same level. The film 106 and the film 124 may be configured to be in contact with each other in a direction 32 perpendicular to a plane defined by the directions 30 and 31 along the semiconductor layer 121A. Thus, the lower surface 100L of the semiconductor layer 121A, which is a lower surface of the film 106, and the upper surface 124U of the film 124 may be in direct contact with each other. As earlier mentioned, the thickness of the film 106 may be in the range from 0.2 μm to 0.35 μm and a depth of each via hole 125 may be as small as about 1 μm, a length of each conductive plug of the conductive plugs 128a to 128d may be much smaller in comparison with a length of a conventional TSV (e.g., approximately 50 μm). Thus, a parasitic capacitance of each conductive plug of the conductive plugs 128a to 128d may become extremely small and negligible. Due to the shallow via hole 125, a volume of the conductive portion 127 may be reduced and peel-off decoupling from the TDV pad 119 due to thermal expansion and thermal contraction may be prevented. A thickness "D" between the upper surface 100U of the semiconductor layer 121A and the upper surface 122U of the interlayer dielectric film 122b may be configured to be approximately 3 μm to 5 μm, thus it is possible to reduce a thickness of the semiconductor device 10 to as small as 4 μm to 6 μm.

Figure 1D:
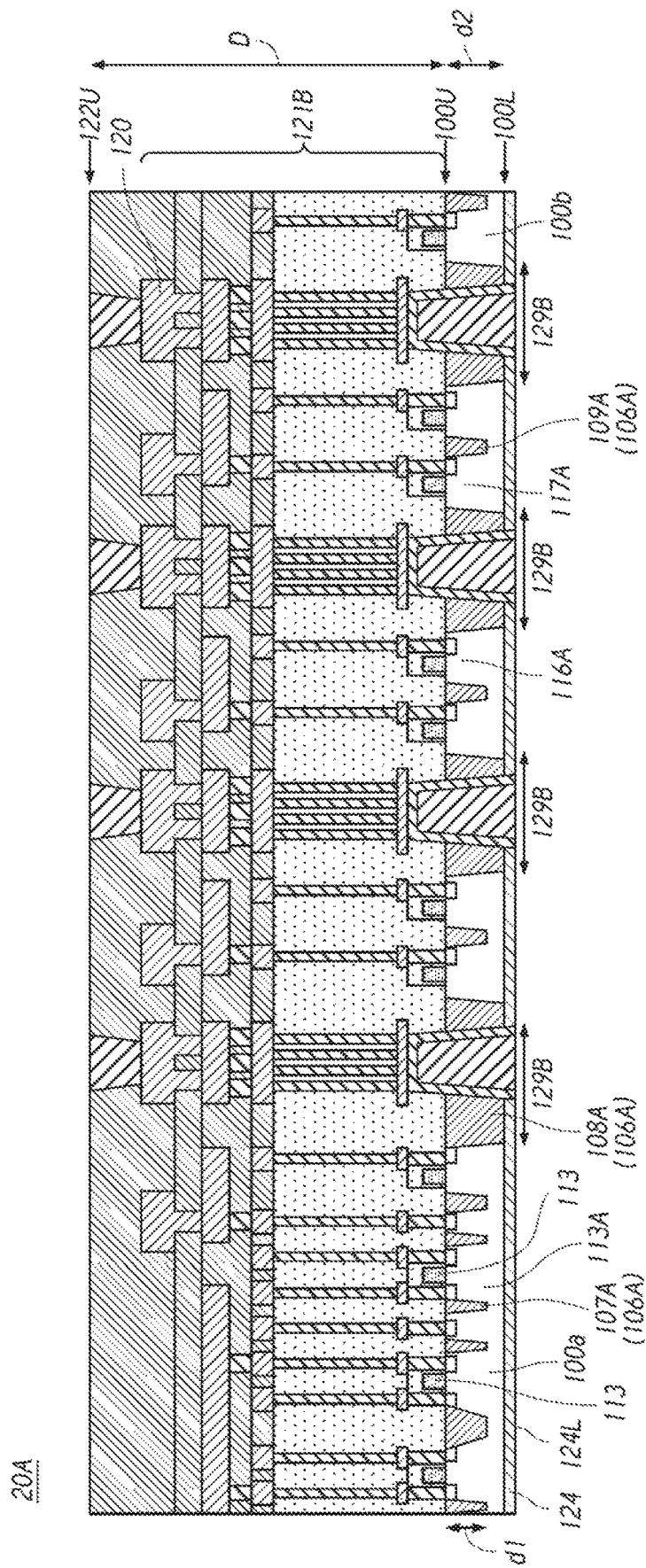
FIG. 1D is a schematic diagram of conductive plugs in a chip, in accordance with an embodiment of the present disclosure.

FIG. 1D is a schematic diagram of conductive plugs in a chip 20A of a semiconductor device, in accordance with an embodiment of the present disclosure. For example, the chip 20A may be the chip 10 in FIG. 1A and FIG. 1D may be a cross-sectional view showing the chip 20A located on a line A-A shown in FIG. 1A. Description of components in FIG. 1D corresponding to components in FIG. 1C will not be repeated and changes from FIG. 1C will be described. In the semiconductor device 20A, bottom surfaces of a film 106A including a memory STI region 107A, a peripheral STI region 109A may be isolated from (e.g., not in direct contact with) the upper surface 124U of the film 124. A bottom surface 100L of the film 106A in a TDV-STI region 108A may be configured to be in direct contact with the upper surface 124U of the film 124. Thus, a depth d2 of the TDV-STI region 108A may be configured to be greater than a depth d1 of the memory STI region 107A and the peripheral STI region 109A. For example, the depth d1 of the memory STI region 107A and the peripheral STI region 109A may be approximately in a range between 0.2 μm and 0.35 μm while the depth d2 of the TDV-STI region 108A may be approximately in a range between 0.4 μm and 0.6 μm. Thus, a plurality of memory transistors 113 in a plurality of memory device regions 113A may be coupled through the semiconductor material 100a below the memory STI region 107A. The peripheral device regions including the peripheral first device region 116A and the peripheral second device region 117A that are disposed around the TDV region 129B may be coupled through the semiconductor material 100a. For example, the memory device region 113A and the peripheral device regions 116A and 117A may be configured in a double well structure or a triple well structure.

Figure 1E:
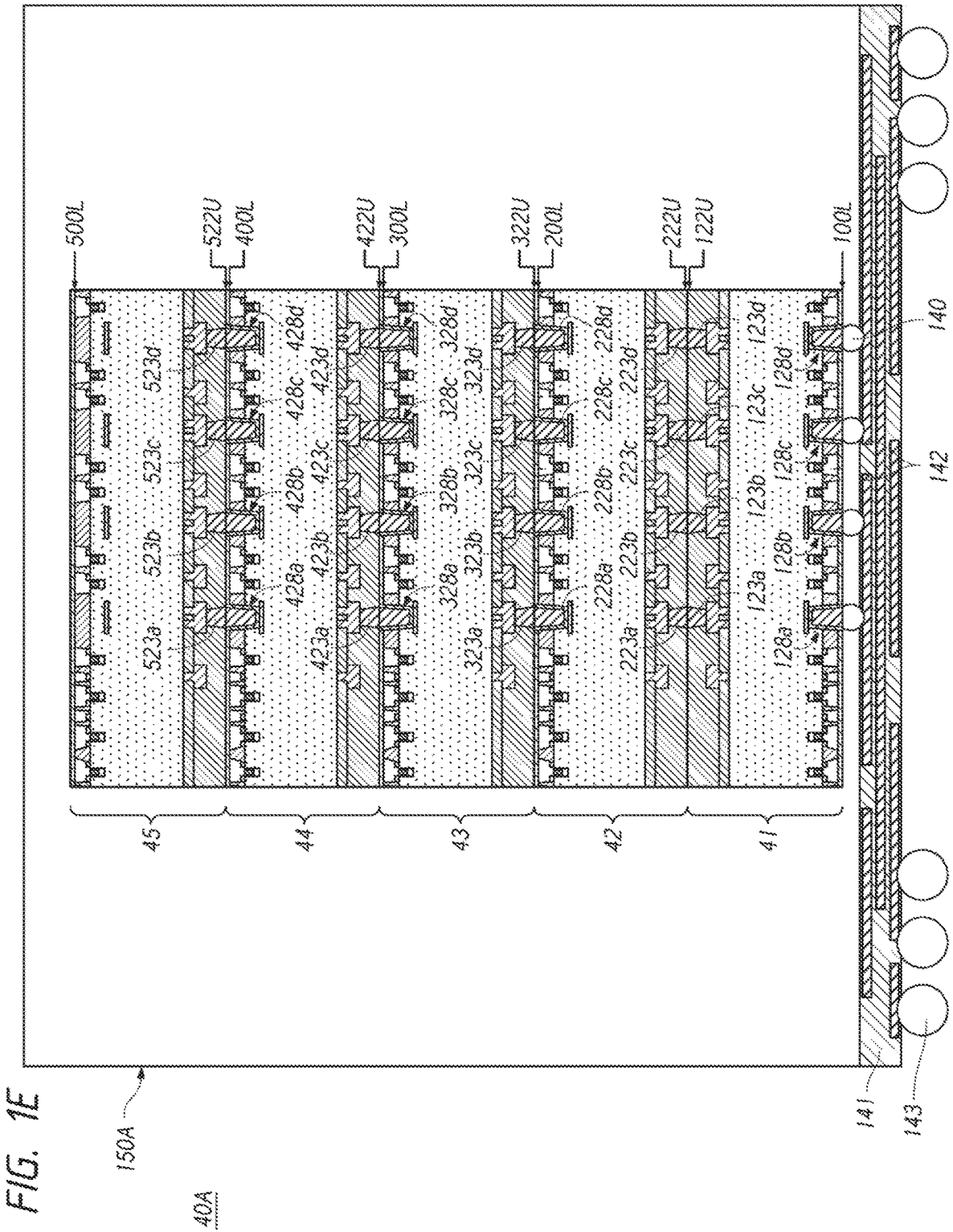
FIG. 1E is a schematic diagram of conductive plugs in stacked chips of a semiconductor device, in accordance with an embodiment of the present disclosure.

FIG. 1E is a schematic diagram of conductive plugs in stacked chips 41 to 45 of a semiconductor device 40A, in accordance with an embodiment of the present disclosure. Description of components in FIG. 1E corresponding to components in FIG. 1C will not be repeated and additional components in FIG. 1E will be described. For example, the semiconductor device 40A may include a stacked chip package (e.g., multi-chip package: MCP) 150A. For example, the MCP 150A may include a plurality of chips 41 to 45 stacked to one other. For example, each of the plurality of chips 41 to 45 may be a chip 20 in FIG. 1C. A plurality of stacked chips 42 to 45, except a chip 41, may have a similar structure, and a number of the plurality of stacked chips may not be limited to four. For example, each of the plurality of chips 41 to 45 may be a chip 20A in FIG. 1D. For example, the chip 41, having a structure of the chip 20, may include conductive plugs 128a to 128d that may be coupled to an interposer 141 through solder bumps 140. The interposer 141 may be coupled to an external apparatus through a redistribution layer 142 and solder balls 143. For example, the chip 41 may include contact bumps 123a to 123d on an upper surface 122U. The contact bumps 123a to 123d may be coupled to contact bumps 223a to 223d of the chip 42 on a surface 222U, respectively. For example, the chip 42 may include conductive plugs 228a to 228d on a surface 200L of the chip 42. The TSVs 228a to 228d may be coupled to contact bumps 323a to 323d of the chip 43 on a surface 322U. Similarly, the conductive plugs 328a to 328d on a surface 300L of the chip 43 may be coupled to contact bumps 423a to 423d of the chip 44 on a surface 422U. The TSVs 428a to 428d on a surface 400L of the chip 44 may be coupled to contact bumps 523a to 523d of the chip 45 on a surface 522U.

As shown in FIG. 1E, the TSVs 128a to 128d on the chip 41 may be coupled to the interposer 141 via the solder bumps 140 and the chip 42 may be stacked on the chip 41 and coupled to the chip 41 via the contact bumps 223a to 223d coupled to the contact bumps 123a to 123d. Here, the chips 42 to 45 may include the surfaces 222U, 322U, 422U and 522U as lower surfaces, respectively and the chips 42 to 45 may include the surfaces 200L, 300L, 400L and 500L as upper surfaces respectively, unlike the chip 41. The chip 43 may be stacked on the chip 42 and coupled to the chip 42 via the contact bumps 323*a* to 323*d* coupled to the TSVs 228*a* to 228*d*. Thus, each of chips 42 to 45 may include the conductive plugs on the upper surface of each chip and the contact bumps located on the lower surface of each chip in a stacked structure. For example, the conductive plugs and the contact bumps coupling each chip to its adjacent chip may be implemented using metal (e.g., copper, etc.).

Figure 1F:
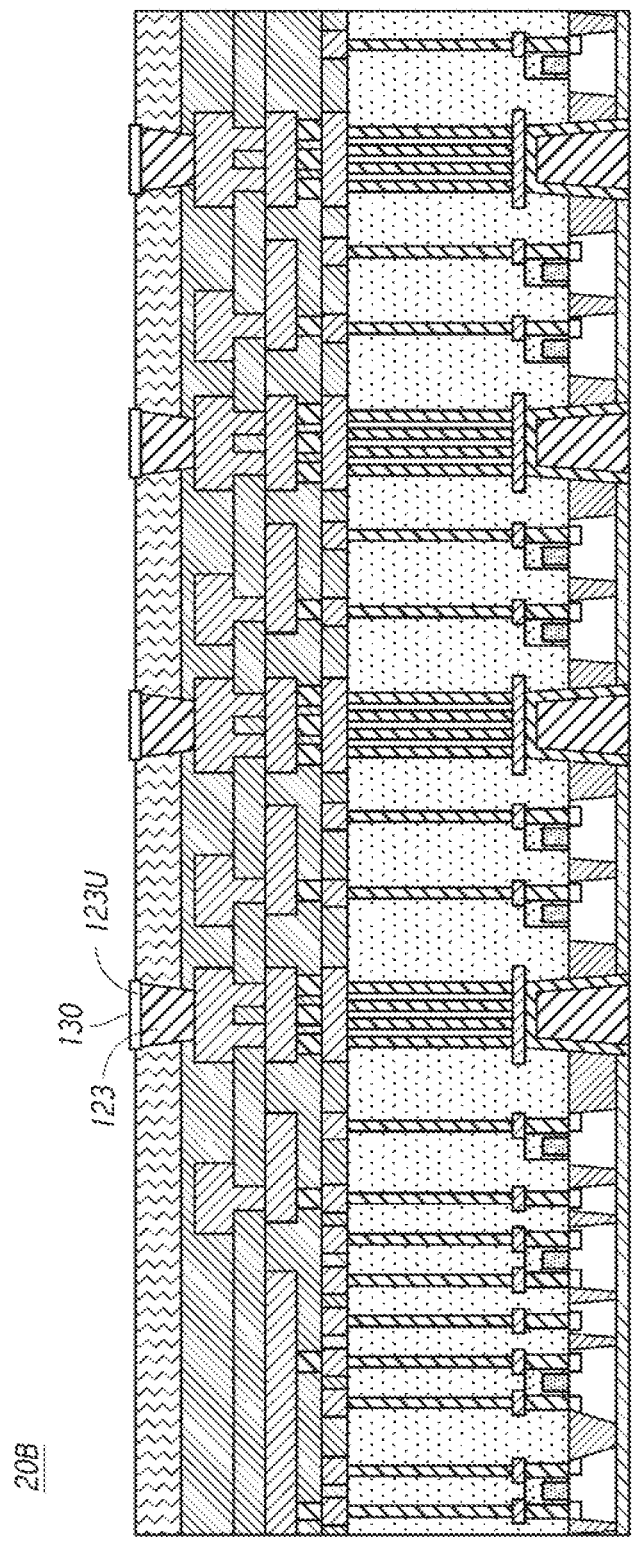
FIG. 1F is a schematic diagram of conductive plugs in a chip of a semiconductor device, in accordance with an embodiment of the present disclosure.
Figure 2:
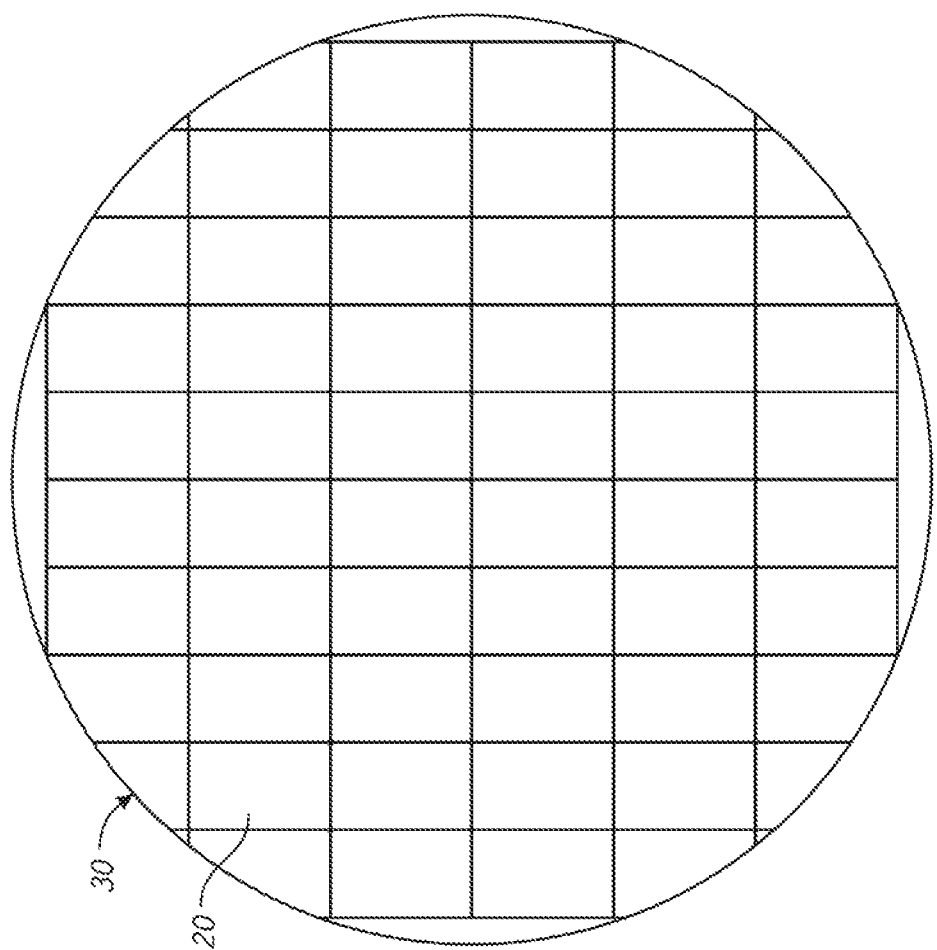
FIG. 2 is a simplified layout diagram of chips included in a semiconductor substrate, in accordance with an embodiment of the present disclosure.

In another embodiment, solder bumps 123 may be disposed on the contact bumps 123. FIG. 1F is a schematic diagram of conductive plugs in a chip 20B of a semiconductor device, in accordance with an embodiment of the present disclosure. Description of components in FIG. 1F corresponding to components in FIG. 1C will not be repeated and changes from FIG. 1F will be described. For example, the chip 20B may include solder bumps 130. Each solder bump 130 may be on the contact bump 123 and coupled to the contact bump 123 at the upper surface 123U. FIG. 1G is a schematic diagram of conductive plugs in stacked chips of a semiconductor device 40B, in accordance with an embodiment of the present disclosure. Description of components in FIG. 1G corresponding to components in FIG. 1F will not be repeated and additional components in FIG. 1F will be described. In a MCP 150B of the semiconductor 40B, conductive plugs 228*a* to 228*d*, 328*a* to 328*d*, 428*a* to 428*d* may be coupled to contact bumps 323*a* to 323*d*, 423*a* to 423*d*, 523*a* to 523*d* via solder bumps 330, 430 and 530, respectively. In order to manufacture the MCP 150B, a plurality of chips may be stacked to each other. For example, a first semiconductor substrate 30 having a thickness of approximately 750 μm may be provided. FIG. 2 is a simplified layout diagram of chips 20 included in the first semiconductor substrate 30, in accordance with an embodiment of the present disclosure. For example, the first semiconductor substrate 30 may have a round shape. The chips 20 may be partitioned into rectangular regions for cutting. Although not particularly limited, a semiconductor single crystal made of silicon or a compound thereof may be used as the first semiconductor substrate 30. For example, a thickness of the first semiconductor substrate 30 may be approximately 750 μm. Similarly, a second semiconductor substrate 30' (not shown) may be provided. A layer 20L' may be formed to include the second semiconductor substrate 30' may be coupled to a layer 20L that may be formed to include the first semiconductor substrate 30, by coupling the contact bumps 123*a* to 123*d* to the contact bumps 223*a* to 223*d* via solder bumps 130 and 230.

The second semiconductor substrate 30' may have a surface that may be polished on a side opposite to the first semiconductor substrate 30. The surface may be polished to thin the second semiconductor substrate 30' until exposing a film 106' on the surface. For example, the second semiconductor substrate 30' of 750 μm may be thinned to approximately 0.5 μm to form a semiconductor layer 121A' of the second semiconductor substrate 30'. A film 124' for the second semiconductor substrate 30' may be formed on the semiconductor layer 121A of the second semiconductor substrate 30' to cover the second semiconductor substrate 30', and the TSVs 228*a* to 228*d* of the second semiconductor substrate 30' may be formed in TDV regions, similarly to the TDV regions 129A in FIG. 1C and the TDV regions 129B in FIG. 1D. Thus, the layer 20L' including the second semiconductor substrate 30' may be stacked onto the layer 20L including the first semiconductor substrate 30.

Furthermore, a third semiconductor substrate 30" having a thickness of 750 μm may be provided. A layer 20L" including the third semiconductor substrate 30" may be stacked onto the layer 20L' including the second semiconductor substrate 30', by coupling the contact bumps 323*a* to 323*d* to the TSVs 228*a* to 228*d* in the second semiconductor substrate 30'. A surface of the third semiconductor substrate 30" opposite to the second semiconductor substrate 30' may be polished to thin the third semiconductor substrate 30" until a film 106" is exposed, similar to thinning the second semiconductor substrate 30', to form a semiconductor layer 121A" of the third semiconductor substrate. Similarly, a film 124" for the third semiconductor substrate 30" may be formed on the semiconductor layer 121A" of the third semiconductor substrate 30", and the conductive plugs 328*a* to 328*d* of the third semiconductor substrate 30" may be formed in a TDV region. Thus, the layer 20L" including third semiconductor substrate 30" may be stacked on the layer 20L' including the second semiconductor substrate 30'. In a similar manner, a plurality of layers 20L''', 20L'''' . . . including semiconductor substrates 30''', 30'''' . . . , respectively, may be coupled to the layers 20L", 20L''' . . . respectively. After polishing and thinning a top semiconductor substrate including an uppermost layer, conductive plugs may not be formed on the top semiconductor substrate. After stacking the plurality of layers, the stacked layers 20L' to 20L'''' may be laid as the first semiconductor substrate 30 becomes an uppermost layer. The first semiconductor substrate 30 may be polished until a film 106 may be exposed by thinning the first semiconductor substrate 30 to about 0.5 μm, thus a semiconductor layer 121A of the first semiconductor substrate 30 is formed. A film 124 may be formed on the first semiconductor substrate 30, and conductive plugs 128*a* to 128*d* may be formed in TDV regions, such as the TDV regions 129A in FIG. 1C and the TDV regions 129B in FIG. 1D. After forming the conductive plugs 128*a* to 128*d*, solder bumps 140 may be formed on the conductive plugs 128*a* to 128*d*. The stacked layers may be cut into a plurality of chips 20. Each chip 20 may be laid to have a bottom layer that is the first semiconductor substrate 30 and the solder bumps 140 may be coupled to an interposer 141. A resin-sealing process may be applied to each chip 20 to form a package.

Figure 3A:
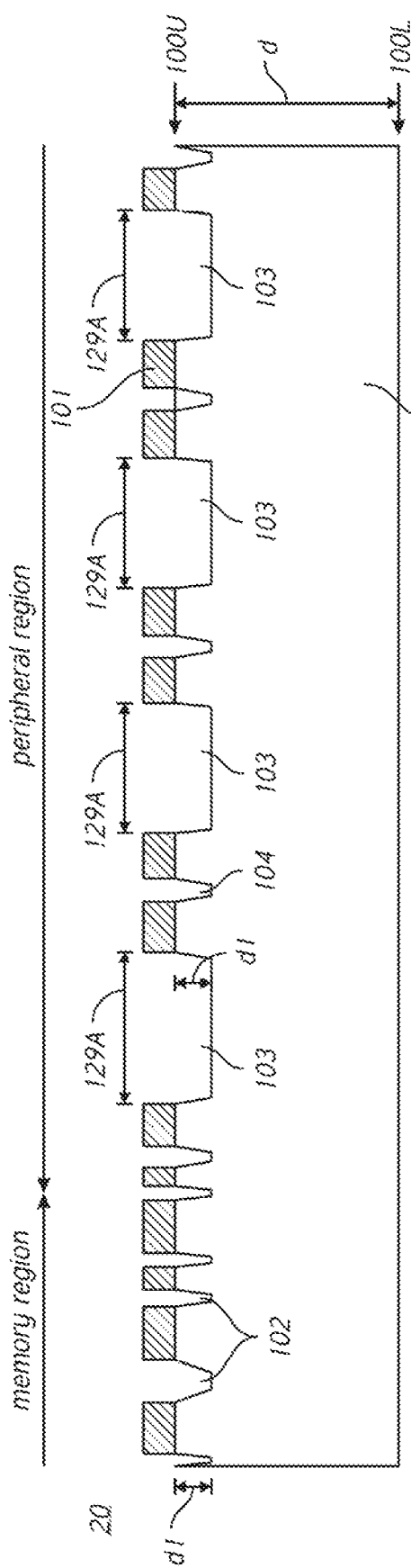
FIG. 3A is a schematic diagram of a portion of a chip in a semiconductor device, in accordance with an embodiment of the present disclosure.

FIG. 3A is a schematic diagram of a portion of a chip 20 in a semiconductor device, in accordance with an embodiment of the present disclosure. For example, the chip 20 may be the chip 10 in FIG. 1A or the chip 20 in FIG. 1C, and FIG. 3A may be a cross-sectional view showing the chip 20 along on a line A-A' shown in FIG. 1A, including trenches formed on the semiconductor substrate 100 for element separation by shallow trench isolation (STI). The semiconductor substrate 100 may have an upper surface 100U and a lower surface 100L, and a thickness "d" of the semiconductor substrate may be approximately 750 μm. For example, a mask pattern 101 may be deposited on the semiconductor substrate 100 by using a photolithography method. A plurality of STI trenches may be formed within the semiconductor substrate 100 by using a plasma dry etching method. For example, memory STI trenches 102 may be formed in the memory cell region. On the peripheral region, in addition to peripheral trenches 104, TDV-STI trenches 103 may be formed to provide TDV regions 129A. For example, the TDV-STI trenches 103, the memory STI trenches 102 and the peripheral trenches 104 on the semiconductor substrate 100 may have a common depth of d1 that may be approximately 0.3 μm.

Figure 3B:
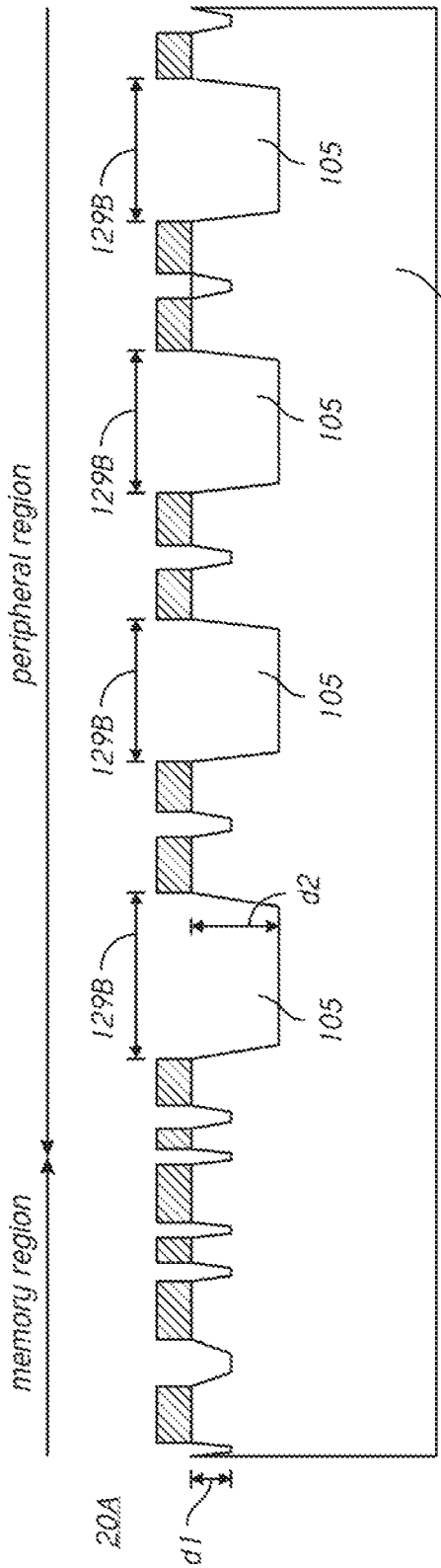
FIG. 3B is a schematic diagram of a portion of a chip in a semiconductor device, in accordance with an embodiment of the present disclosure.

FIG. 3B is a schematic diagram of a portion of a chip 20A in a semiconductor device, in accordance with an embodiment of the present disclosure. For example, the chip 20A may be the chip 10 in FIG. 1A or the chip 20A in FIG. 1D, and FIG. 3B may be a cross-sectional view showing the chip 20A along on a line A-A' shown in FIG. 1A, including trenches formed on the semiconductor substrate 100 for element separation by shallow trench isolation (STI). Description of components in FIG. 3B corresponding to components in FIG. 3A will not be repeated and changes from FIG. 3A including will be described. On the peripheral region, TDV-STI trenches 105 may be formed to provide TDV regions 129B. For example, the TDV-STI trenches 105 may have a common depth of d2 that may be approximately 0.5 µm to 0.6 µm. For example, each TDV-STI trench 105 may have a planar area that is larger than the area of each memory STI trench 102 or the area of each peripheral trench 104. For example, the TDV-STI trenches 105 may be etched deeper by plasma dry etching with a loading effect, to etch a larger area on a substrate deeper than the area of each memory STI trench 102 or the area of each peripheral trench 104 on the substrate. For example, masks may be applied after a first etching of the depth d1 to cover the memory STI trenches 102 and the peripheral STI trenches 104. Thus, additional etching may be applied to the TDV-STI trenches 105 to provide the depth d2.

FIG. 4A is a schematic diagram of a portion of a chip 20 in a semiconductor device, in accordance with an embodiment of the present disclosure. For example, the chip 20 may be the chip 10 in FIG. 1A or the chip 20 in FIGS. 1C and 3A, and FIG. 4A may be a cross-sectional view showing the chip 20 along on a line A-A' shown in FIG. 1A. For example, a film 106 (e.g., an STI dielectric film) may be applied on the semiconductor substrate 100 to fill trenches, including memory STI trenches 102, the peripheral trenches 104, TDV-STI trenches 103 and the mask pattern 101 may be removed. For example, the memory STI region 107 may be formed by applying the film 106 to fill in the memory STI trenches 102 in the memory region, the TDV-STI regions 108 may be formed by applying the film 106 to fill in the TDV-STI trenches 103 in the TDV region 129A, the peripheral STI region 109 may be formed by applying the film 106 to fill in the peripheral tranches 104. As the film 106, a silicon oxide film, a silicon nitride film, a silicon oxynitride film or the like, may be used. The film 106 may be formed by using a chemical vapor deposition (CVD) method or a coating method. The TDV-STI regions 108 may have a lower surface 108L.

FIG. 4B is a schematic diagram of a portion of a chip 20A in a semiconductor device, in accordance with an embodiment of the present disclosure. For example, the chip 20A may be the chip 10 in FIG. 1A or the chip 20A in FIGS. 1D and 3B, and FIG. 4B may be a cross-sectional view showing the chip 20A along on a line A-A' shown in FIG. 1A. Description of components in FIG. 4B corresponding to components in FIG. 4A will not be repeated and changes from FIG. 4A including will be described. For example, a film 106 (e.g., an STI dielectric film) may be applied on the semiconductor substrate 100 to fill trenches, including memory STI trenches 102, the peripheral trenches 104, TDV-STI trenches 103 and the mask pattern 101 may be removed. For example, the TDV-STI regions 110 may be formed by filling the film 106 in the TDV-STI trenches 105 in the TDV region 129B.

Figure 5:
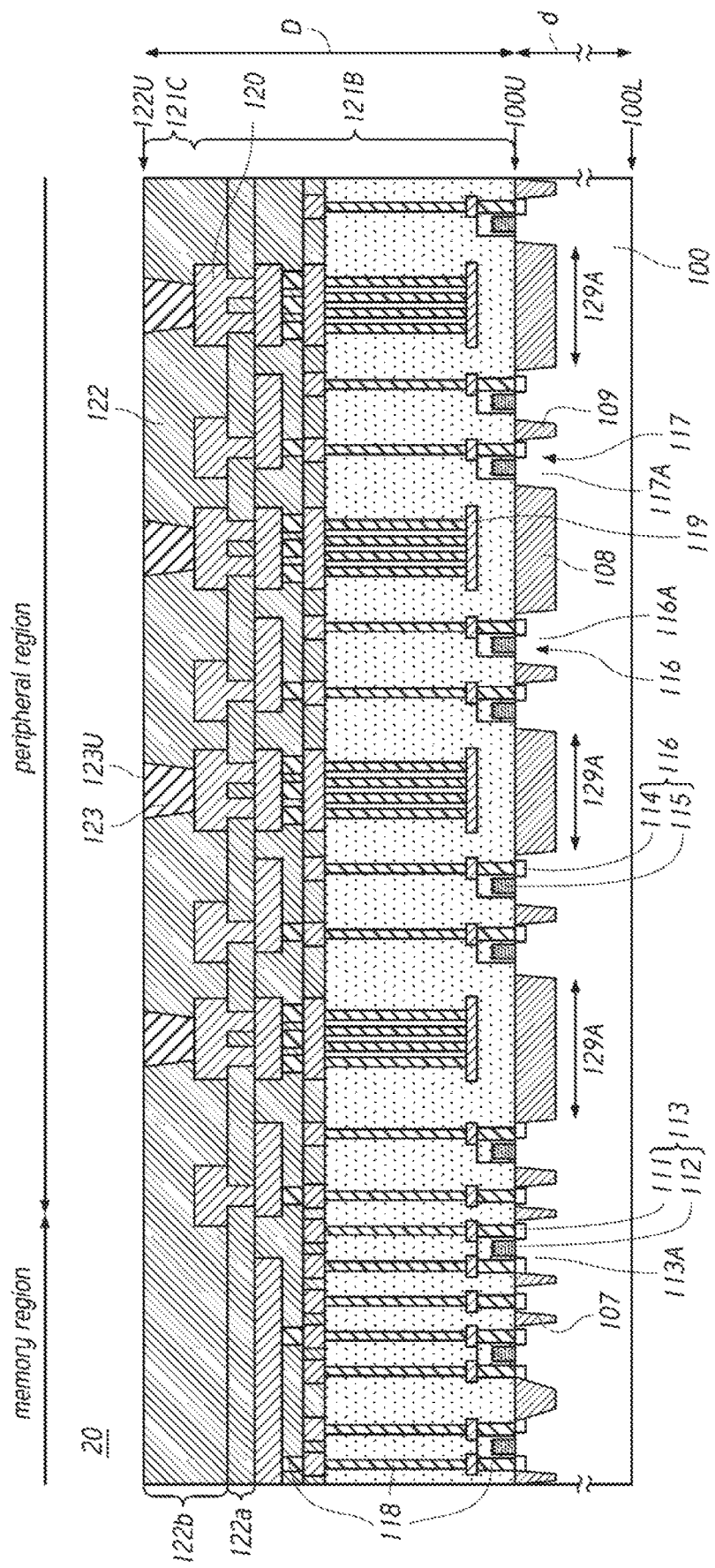
FIG. 5 is a schematic diagram of a chip of a semiconductor device, in accordance with an embodiment of the present disclosure.

FIG. 5 is a schematic diagram of a chip 20 of a semiconductor device, in accordance with an embodiment of the present disclosure. For example, the chip 20 may be the chip 10 in FIG. 1A or the chip 20 in FIGS. 1C, 3A and 4A, and FIG. 5 may be a cross-sectional view showing the chip 20 along on a line A-A' shown in FIG. 1A. After forming STI regions as shown in FIG. 4A, manufacturing processes for memory (e.g., dynamic random access memory (DRAM), NAND-Flash memory) may be applied.

First, a device (e.g., a transistor, etc.) may be formed on an upper surface 100U of a semiconductor substrate 100. For example, a memory transistor 113 having a source/drain 111 in proximity to a gate structure 112 and an impurity diffusion layer may be formed, in a memory device region 113A surrounded by a memory STI region 107. For example, a first peripheral transistor 116 having a source/drain 114 in proximity to a gate structure 115 and an impurity diffusion layer may be formed in a peripheral device region 116A surrounded by a peripheral STI region 109 and a TDV-STI region 108. For example, a second peripheral transistor 117 may be formed in a peripheral device region 117A. A TDV-STI region 108 may be located between the peripheral device regions 116A and 117A.

After forming the transistors 113, 116 and 117, an interconnect layer 121B may be formed by a CVD method or a coating method. The interconnect layer 121B may cover the gate structures 112 and 115. A film 122a may include a plurality of interlayer dielectric films, and wirings for contact plugs 118, TDV pads 119 or the like may be formed during each film formation. By repeating forming of wirings, the interlayer dielectric films and the contact plugs 118, the interconnect layer 121B including contact bump pads 120 in an upper most layer in the plurality of interlayer dielectric films may be formed. For example, the wirings and the contact plugs 118 in the interconnect layer 121B may include metal, such as tungsten, copper or the like.

After forming of the interconnect layer 121B, a contact bump layer 121C may be formed. On the interconnect layer 121B, a film 122b may be formed. Each contact bump 123 may be formed on each contact bump pad 120 and may be coupled to each contact bump pad 120. An upper surface 123U of the contact bumps 123 may be formed to be on a same surface as an upper surface 122U of the interlayer dielectric film 122b. For example, a thickness "d" of a semiconductor substrate 100 may be approximately 750 µm, and a thickness "D" of a chip 20 above the upper surface of the semiconductor substrate 100 may be approximately 5 µm.

Figure 6:
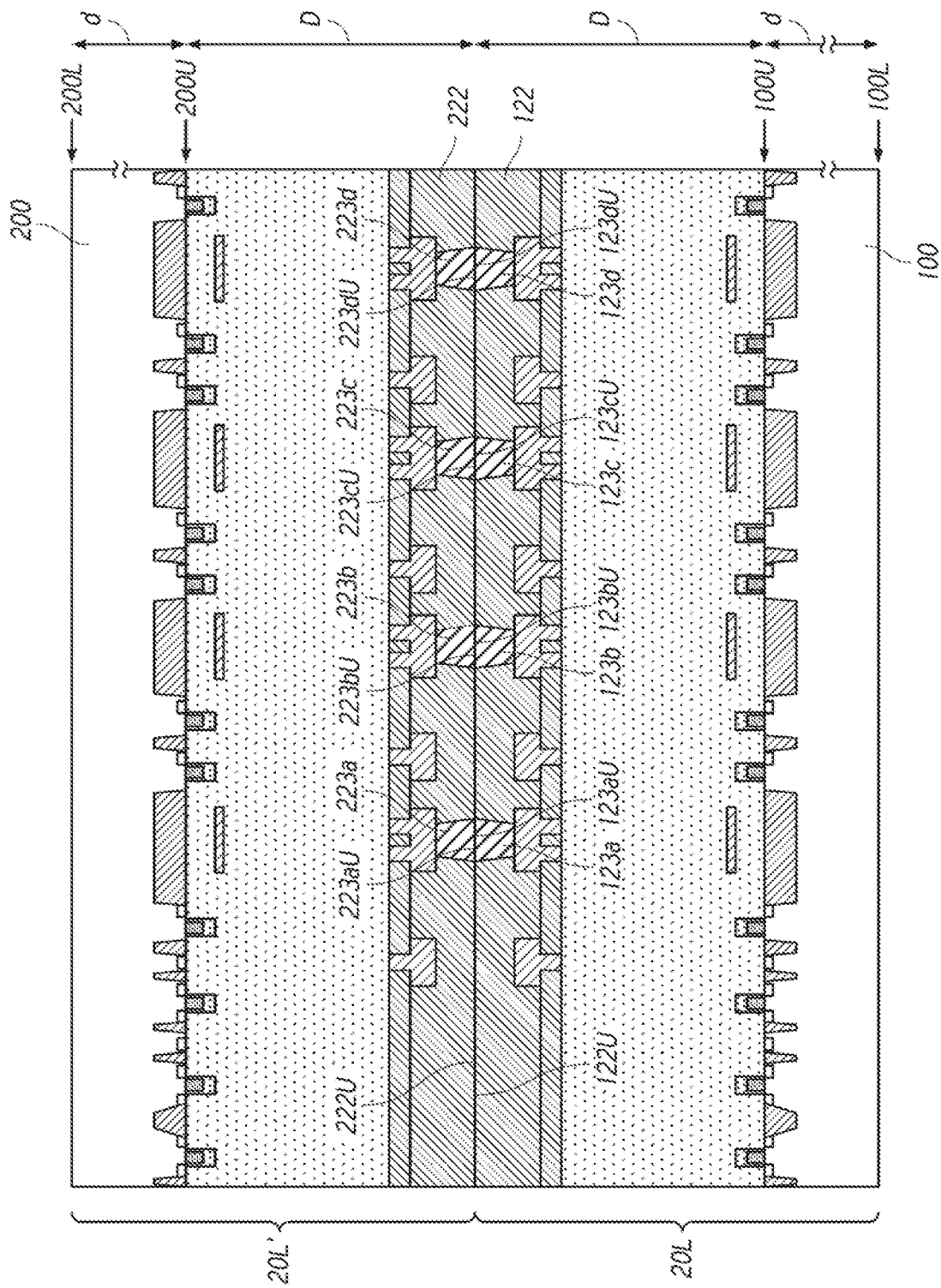
FIG. 6 is a schematic diagram of stacked layers of a semiconductor device, in accordance with an embodiment of the present disclosure.

FIG. 6 is a schematic diagram of stacked layers 20L and 20L' of a semiconductor device, in accordance with an embodiment of the present disclosure. A layer 20L including a first semiconductor substrate 100 may be the chip 20 in FIG. 5 and a layer 20L' including a second semiconductor substrate 200 may be the chip 20 in FIG. 5. Description of components corresponding to components included the chip 20 in FIG. 5 (e.g., the interconnect layer 121B etc.) will not be repeated. The layers 20L and 20L' may be stacked to each other. For example, the layer 20L' may be stacked to the layer 20L by coupling contact bumps 223a to 223d of the layer 200L' to contact bumps 123a to 123d of the layer 20L. For example, the layer 20L' may be laid and stacked on the layer 20L in a manner that the contact bumps 223a to 223d may be placed on the contact bumps 123a to 123d, in contact with each other via upper surfaces 223aU, 223bU, 223cU and 223dU of the contact bumps 223a to 223d on upper surfaces 123aU, 123bU, 123cU, 123dU of the contact bumps 123a to 123d, respectively. Here, the upper surfaces 123aU, 123bU, 123cU, 123dU and an upper surface 122U of an interlayer dielectric film 122 may be on a same continuous surface. Here, the upper surfaces 223aU, 223bU, 223cU, 223dU and an upper surface 222U of an interlayer dielectric film 222 may be on a same continuous surface. For example, a thickness "d" of the second semiconductor substrate 200 may be approximately 750 µm.

Figure 7:
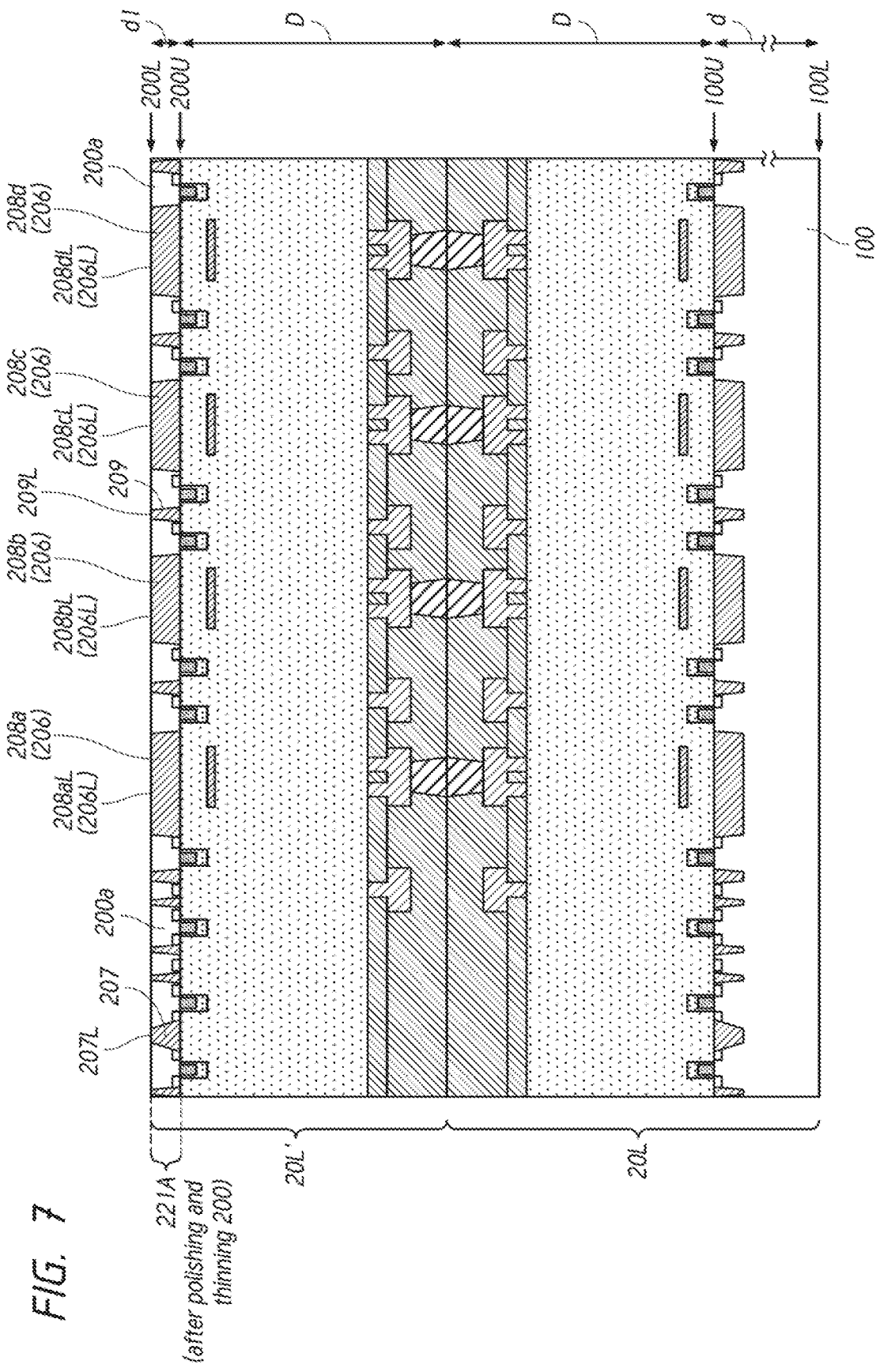
FIG. 7 is a schematic diagram of stacked layers of a semiconductor device, in accordance with an embodiment of the present disclosure.

FIG. 7 is a schematic diagram of stacked layers 20L and 20L' of a semiconductor device, in accordance with an embodiment of the present disclosure. For example, the layers 20L and 20L' may be a chip 20 in FIG. 5. Description of components corresponding to components included the chip 20 in FIG. 5 (e.g., the interconnect layer 121B etc.) will not be repeated. For example, the semiconductor substrate 200 in the layer 20L' may be formed into a thin semiconductor layer. For example, the semiconductor substrate 200 having the thickness "d" of 750 µm may be thinned by polishing a lower surface 200L, such as applying back grinding (BG) and chemical mechanical planarization (CMP) to the lower surface 200L, until exposing a rear surface 206L of a first dielectric film (STI dielectric film) 206. Polishing may be stopped by endpoint detection of the first dielectric film (STI dielectric film) 206 when the rear surface 206L of the first dielectric film (STI dielectric film) 206 is reached. Thus, most of the semiconductor substrate 200 may be removed by polishing and thinning to form a semiconductor layer 221A. For example, the semiconductor layer 221A may include STI regions and a semiconductor material 200a surrounded by the STI regions. For example, a thickness "d1" of the semiconductor layer 221A may be approximately 0.3 µm. While the semiconductor substrate 200 of the layer 20L' may be thinned, the thickness "d" of the first semiconductor substrate 100 in the layer 20L may remain (e.g., a thickness "d", approximately 750 µm, etc.) to be sufficient to maintain a mechanical strength to endure polishing and thinning processes.

Figure 8:
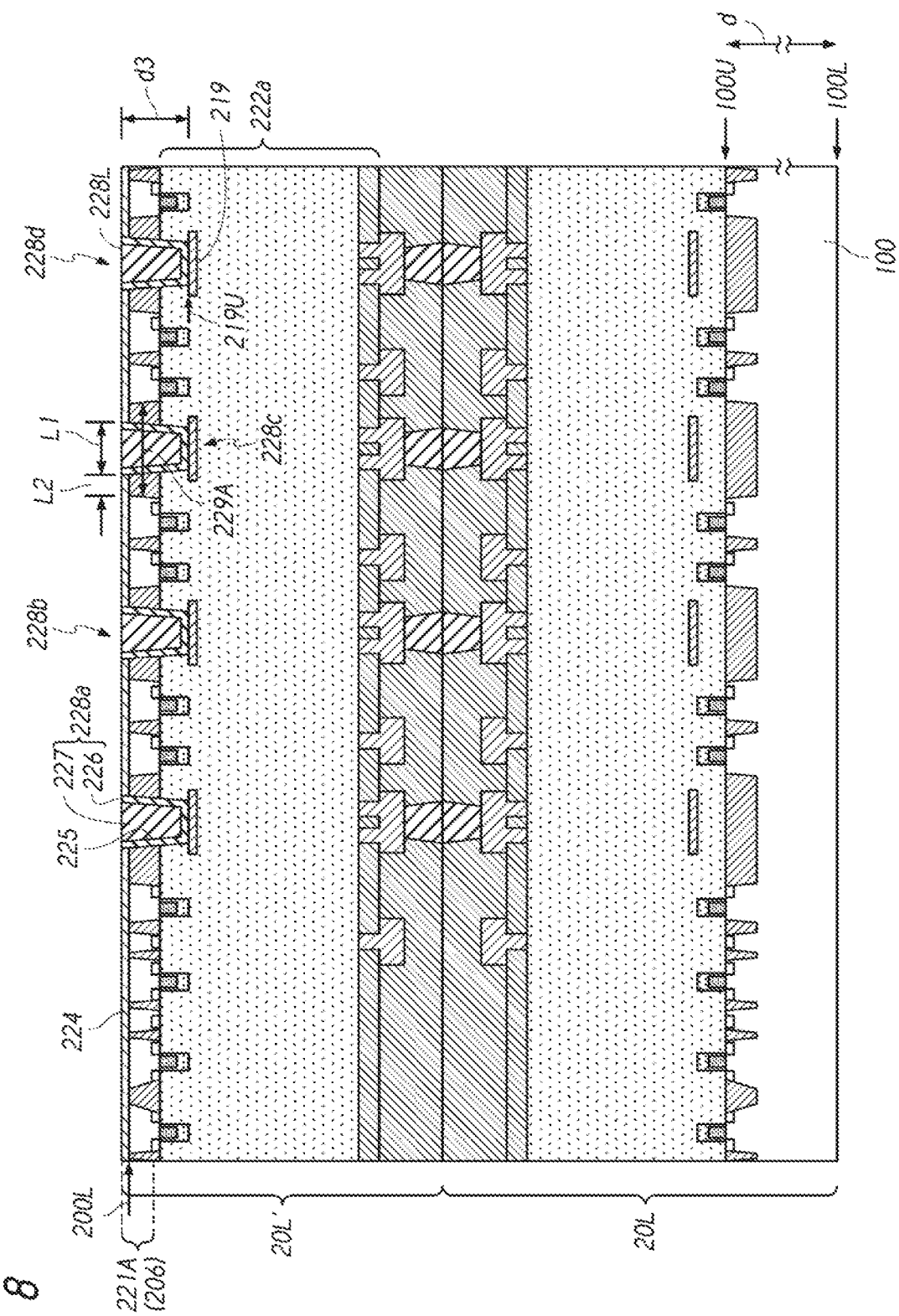
FIG. 8 is a schematic diagram of conductive plugs on stacked layers of a semiconductor device, in accordance with an embodiment of the present disclosure.

FIG. 8 is a schematic diagram of conductive plugs 228a to 228d on stacked layers 20L and 20L' of a semiconductor device, in accordance with an embodiment of the present disclosure. For example, the layers 20L and 20L' may be the chip 20 in FIG. 5. Description of components corresponding to components included the chip 20 in FIG. 5 (e.g., the interconnect layer 121B etc.) will not be repeated. For example, a film 224 may be formed on the semiconductor layer 221A using a CVD method. For example, the film 224 may be a passivation dielectric film (e.g., a silicon oxide film, a silicon nitride film, a silicon oxynitride film, a combination thereof, etc.). A via hole 225 through a portion of the film 224, a film 206 and an interlayer dielectric film 222a may be formed to expose TDV pads 219 in the interlayer dielectric film 222a on a TDV region 229A. Here, the film 206 may be a dielectric film. Conductive plugs 228a to 228d may be formed. For example, each conductive plug of the conductive plugs 228a to 228d may include a barrier portion 226 that covers an inner surface of the via hole 225 and a conductive portion 227 of a conductive material that is configured to fill the via hole 225 covered with the barrier portion 226. For example, the barrier portion 226 may be implemented by tantalum (Ta), tantalum nitride (TaN) or the like. For example, the conductive portion 227 may be implemented by copper (Cu) or the like. For example, a diameter L1 of a cross section of each conductive plug of the conductive plugs 228a to 228d may be approximately 1 µm, whereas a distance L2 from an outer surface of the conductive plug 228a to an end of the TDV region 229A may have a shortest distance that is approximately 0.5 µm. A depth "d3" of the via hole 225, between an upper surface of each TDV pad 219U and an upper surface 228U of each conductive plug may be approximately 1 µm. Thus, the conductive plugs 228a to 228d may be formed on the lower surface 200L of a semiconductor layer 221A on the layer 20L', such as the layer 20L' in FIG. 7.

Figure 9:
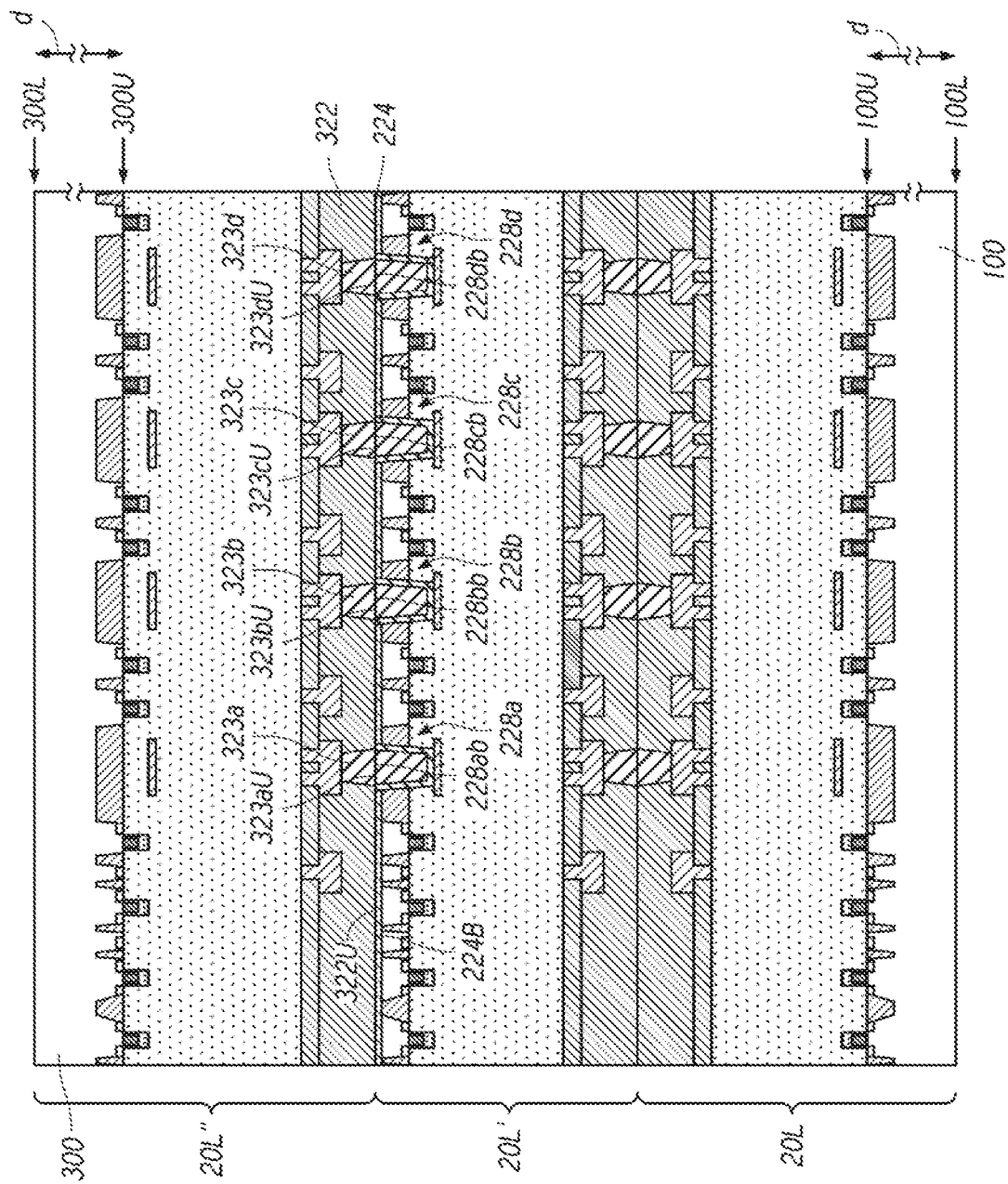
FIG. 9 is a schematic diagram of conductive plugs in stacked layers of a semiconductor device, in accordance with an embodiment of the present disclosure.

FIG. 9 is a schematic diagram of conductive plugs 228a to 228d in stacked layers of a semiconductor device, in accordance with an embodiment of the present disclosure. For example, a layer 20L" including a third semiconductor substrate 300 may be the chip 20 in FIG. 5. For example, layers 20L, 20L' and the layer 20L" may be the chip 20 in FIG. 5. Description of components corresponding to components included the chip 20 in FIG. 5 (e.g., the interconnect layer 121B etc.) will not be repeated. For example, the layer 20L" may be stacked on the layer 20L' by coupling contact bumps 323a to 323d of the layer 201L" to conductive plugs 228a to 228d of the layer 20L'. For example, the layer 20L" may be laid and stacked on the layer 20L' in a manner that the contact bumps 323a to 323d may be placed on the conductive plugs 228a to 228d, in contact with each other via upper surfaces 323aU, 323bU, 323cU and 323dU of the contact bumps 323a to 323d on upper surfaces 228ab, 228bb, 228cb, 228db of the conductive plugs 228a to 228d, respectively. Here, the upper surfaces 323aU, 323bU, 323cU, 323dU and an upper surface 322U of an interlayer dielectric film 322 may be on a same continuous surface. Here, the upper surfaces 228ab, 228bb, 228cb, 228db and an upper surface 224B of a film 224 may be on a same continuous surface. For example, a thickness "d" of the third semiconductor substrate 300 may be approximately 750 µm.

Figure 10:
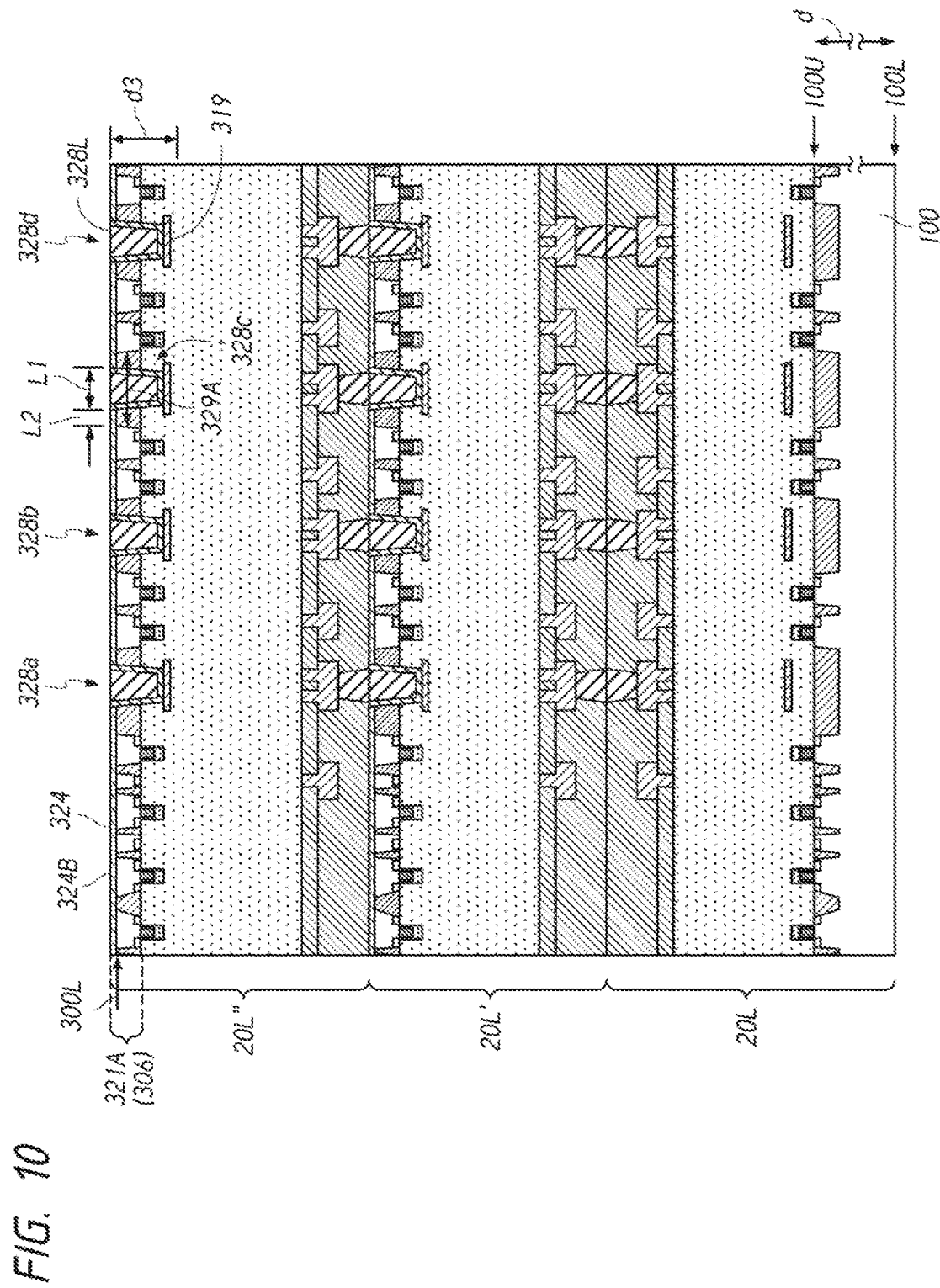
FIG. 10 is a schematic diagram of conductive plugs in stacked layers of a semiconductor device, in accordance with an embodiment of the present disclosure.

FIG. 10 is a schematic diagram of conductive plugs 328a to 328d in stacked layers 20L, 20L' and 20L" of a semiconductor device, in accordance with an embodiment of the present disclosure. For example, the layers 20L, 20L' and 20L" may be the chip 20 in FIG. 5. Description of components corresponding to components included the chip 20 in FIG. 5 (e.g., the interconnect layer 121B etc.) will not be repeated. For example, polishing and thinning the semiconductor substrate 300 as polishing and thinning the semiconductor substrate 200 with polishing as described earlier referring to FIG. 7 may be performed and a film 324 may be formed on the semiconductor layer 321A using a CVD method. Conductive plugs 328a to 328d may be formed by providing via holes and using the CVD method and the plating method as described earlier referring to FIG. 8. For example, a diameter L1 of a cross section of each conductive plug of the conductive plugs 328a to 328d may be approximately 1 µm, whereas a distance L2 from an outer surface of the conductive plug 328a to an end of the TDV region 329A may have a shortest distance that is approximately 0.5 µm. A depth "d3" of each conductive plug of the conductive plugs 328a to 328d may be approximately 1 µm. Thus, the conductive plugs 328a to 328d may be formed on the lower surface 300L of a semiconductor layer 321A on the layer 20L". An upper surface 324S of the film 324 and an upper surface 328L of each conductive plug of the conductive plugs 328a to 328d may be on a same continuous surface.

Figure 11:
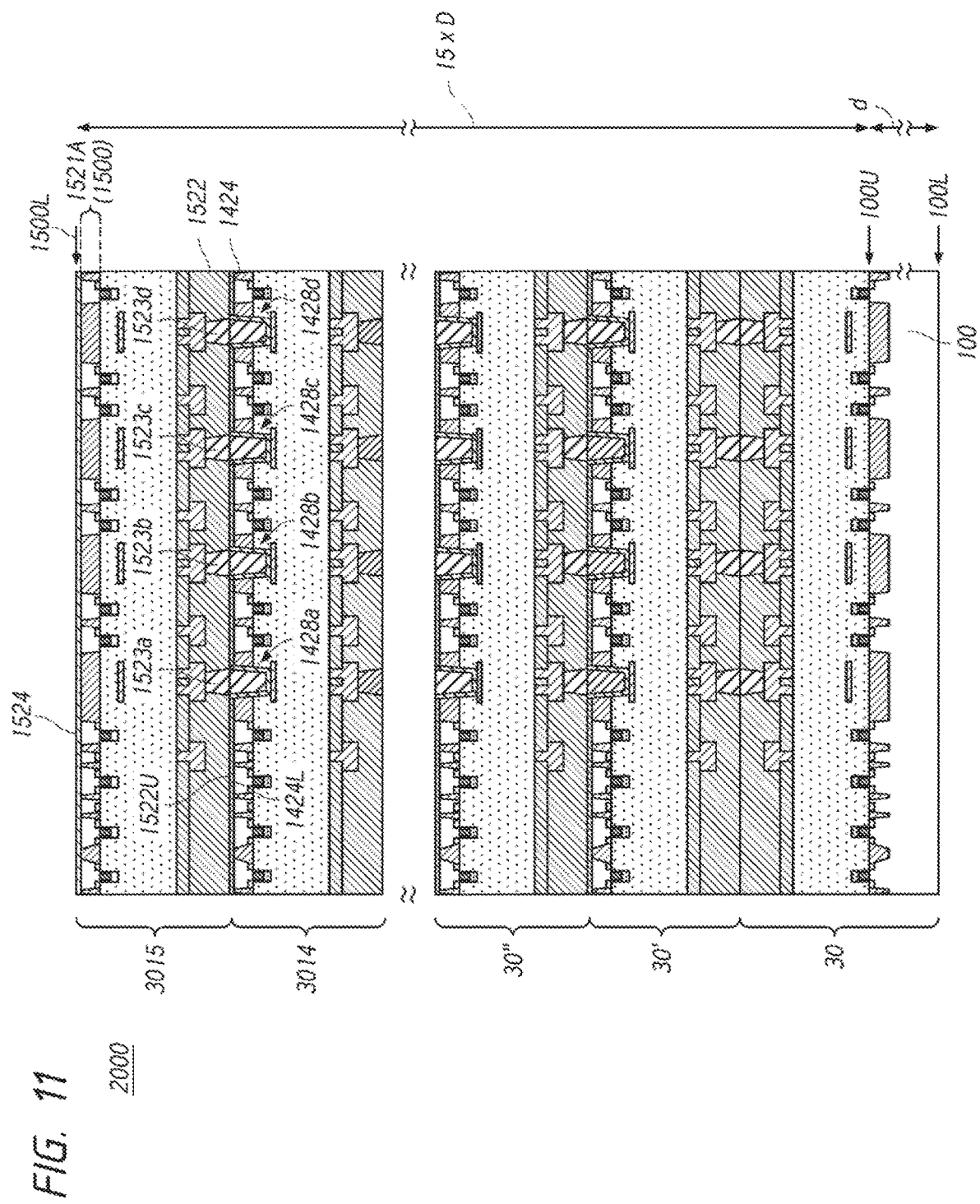
FIG. 11 is a schematic diagram of conductive plugs in stacked layers of a semiconductor device, in accordance with an embodiment of the present disclosure.

FIG. 11 is a schematic diagram of conductive plugs in stacked layers 2000 of a semiconductor device, in accordance with an embodiment of the present disclosure. For example, the stacked layers 2000 may include layers 30, 30', 30", . . . , 3014 and 3015 that may be stacked to each other in an order as listed. There may be a number of layers between 30" and 3014, which are not shown in FIG. 11. For example, the number of layers 30 to 3015 may be a chip 20 in FIG. 5. Description of components corresponding to components included the chip 20 in FIG. 5 (e.g., the interconnect layer 121B etc.) will not be repeated. For example, a layer 3015 may include a semiconductor layer 1521A that may be formed by thinning a semiconductor substrate 1500 (not shown). A film 1524 may be formed on an upper surface 1500L of the semiconductor substrate 1500 thinned into the semiconductor layer 1521A in the same manner as in the other layers. The layer 3015 may be an uppermost layer of the plurality of layers 2000, thus formation of conductive plugs may not be performed. For example a thickness "D" of each layer may be approximately 6 μm and a thickness of layers from the layer 30' to the layer 3015 may be about fourteen times of the thickness D (14×D) (e.g., approximately 84 μm). The semiconductor substrate 100 may not be thinned and still remains with a thickness of "d" (e.g., approximately 750 μm) between an upper surface 100U and a lower surface 100L. The semiconductor substrate 100 may function as a base substrate to maintain a mechanical strength to endure a sequence of manufacturing processes of stacked substrates until the semiconductor substrate 1500 in the uppermost layer 3015 may be formed, polished and thinned. The semiconductor substrate 100 may be polished and thinned prior to forming a package, in order to reduce stress in a cutting process of the plurality of layers 2000 into chips 20, once formation of the semiconductor substrate 1500 in the uppermost layer 3015 is completed.

Figure 12:
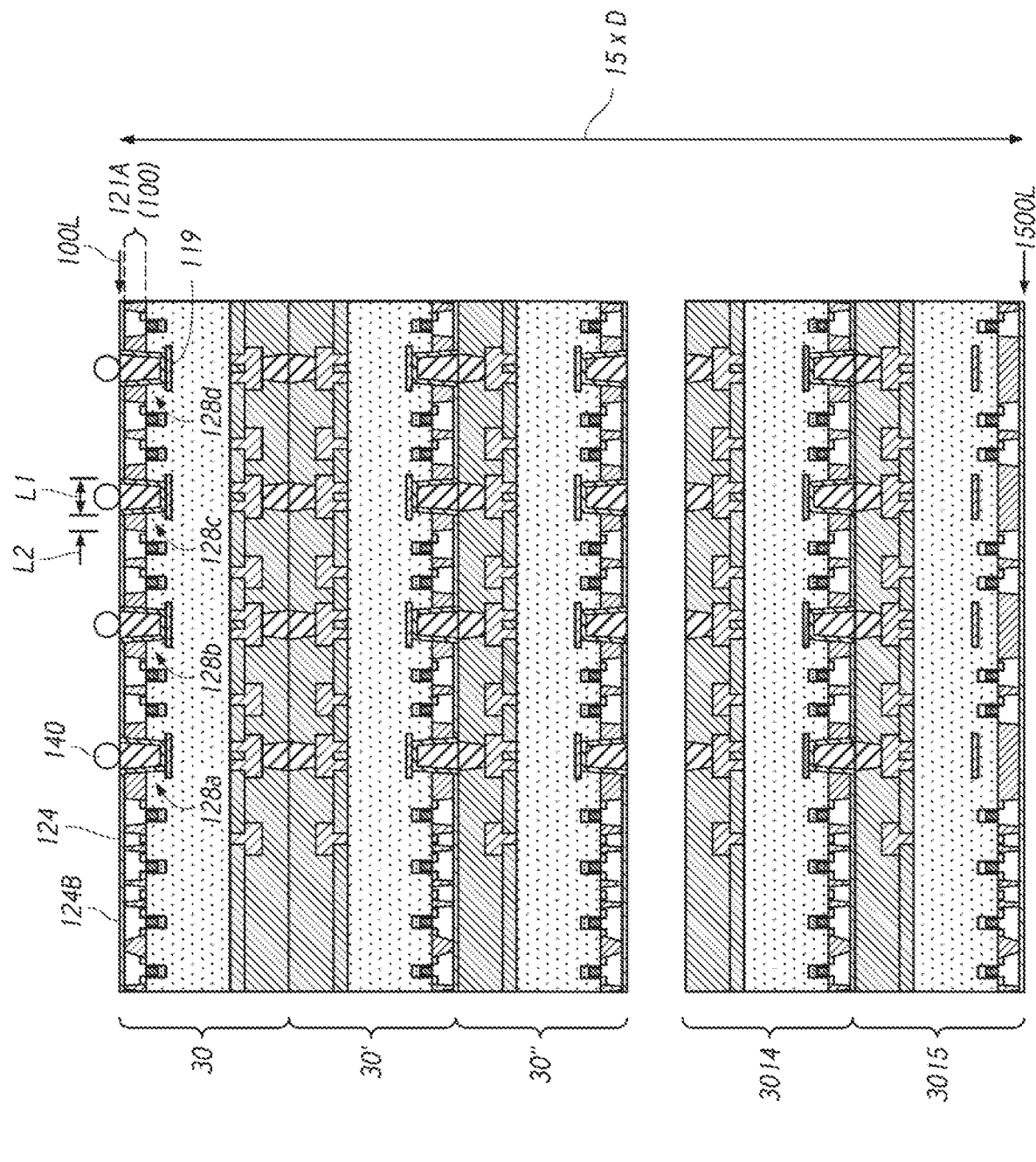
FIG. 12 is a schematic diagram of conductive plugs in stacked layers of a semiconductor device, in accordance with an embodiment of the present disclosure.

FIG. 12 is a schematic diagram of conductive plugs in stacked layers 2000 of a semiconductor device, in accordance with an embodiment of the present disclosure. The layers 2000 may be laid to have the upper surface 1500L as a lower surface. For example, polishing and thinning the semiconductor substrate 100 as polishing and thinning the semiconductor substrate 200 with polishing as described earlier referring to FIG. 7 may be performed to form a semiconductor layer 121A and a film 124 may be formed on the semiconductor layer 121A. Conductive plugs 128a to 128d may be formed by providing via holes and using the CVD method and the plating method as described earlier referring to FIG. 8. A solder bump 140 may be formed on a surface of each conductive plug of the conductive plugs 128a to 128d, where the surface may be continuous with an upper surface 124B of the film 124. After the solder bumps 150 are formed on the conductive plugs 128a to 128d, the layers 2000 may be laid to have the surface 100L as a lower surface, and the conductive plugs 128a to 128d may be coupled to an interposer 141 as shown in FIG. 1G to form a package. Because a thickness of the layers 2000 may be about fifteen times of the thickness D (15×D) (e.g., approximately 90 μm), a mechanical strength may of the layers 2000 may be sufficient to endure polishing and thinning processes of the semiconductor substrate 100. Optionally, a supporting substrate (not shown) may be disposed on the surface 1500L prior to polishing and thinning processes of the semiconductor substrate 100.

Type of devices and materials used in the embodiments described the above are merely examples. However, in other embodiments, combinations of the types of devices and materials other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a substrate including a first region and a second region;
   a conductive plug disposed through the second region; and
   a plurality of trenches in the first region, wherein the conductive plug is separated from adjacent ones of the plurality of trenches by a first width, and
   wherein each of the plurality of trenches is separated from adjacent others of the plurality of trenches by a second width which is smaller than the first width.

2. The apparatus of claim 1, wherein the second region has an area greater than an area of the first region.

3. The apparatus of claim 2, wherein the area of the second region is at least ten times larger than the area of the first region.

4. The apparatus of claim 1, wherein a distance from an outer surface of the conductive plug to an edge of the second region is in a range from about 0.5 um to about 1.5 um.

5. The apparatus of claim 1, wherein the first region and the second region are included in a peripheral region of a memory, and wherein the peripheral region is adjacent to at least one memory region including at least one memory cell.

6. The apparatus of claim 1, wherein the adjacent ones of the plurality of trenches to the conductive plug are a first depth, and wherein the adjacent others of the plurality of trenches are a second depth different from the first depth.

7. The apparatus of claim 1, wherein the conductive plug is a through-dielectric via (TDV) and wherein the substrate is a semiconductor substrate.

8. The apparatus of claim 1, wherein the first region and the second region are formed from a film.

9. The apparatus of claim 1, further comprising a plurality of transistors disposed in the plurality of trenches.

10. An apparatus comprising:
    a substrate including a memory mat cell region and a peripheral region;
    a peripheral shallow trench isolation (STI) region disposed in the peripheral region, wherein the peripheral STI region includes a through-dielectric via (TDV) region; and
    a conductive plug positioned in the TDV region,
    wherein the TDV region has a first area, and wherein the peripheral STI region outside the TDV region has a second area smaller than the first area.

11. The apparatus of claim 10, wherein the peripheral STI region includes a plurality of TDV regions arranged in a grid pattern.

12. The apparatus of claim 10, wherein the peripheral STI region comprises a plurality of trenches, wherein ones of the plurality of trenches which are adjacent to the TDV region are separated from the conductive plug by a first width, and wherein each of the plurality of trenches is separated from adjacent others of the plurality of trenches by a second width smaller than the first width.

13. The apparatus of claim 12, wherein the plurality of trenches are the same depth.

14. The apparatus of claim 12, wherein the plurality of trenches include trenches having a first depth and trenches having a second depth different from the first depth.

15. The apparatus of claim 10, wherein the first area is at least ten times larger than the second area.

16. The apparatus of claim 10, further comprising a film disposed over the peripheral region, wherein the conductive plugs extend through the film.

17. An apparatus comprising:
a stacked chip package including a plurality of chips, each of the plurality of chips comprising:
a through-dielectric via (TDV) configured to couple the chip to adjacent ones of the plurality of chips;
a peripheral TDV region surrounding the TDV; and
a plurality of trenches surrounding the peripheral TDV region,
wherein the distance from an edge of the TDV to the plurality of trenches is greater than a distance between adjacent ones of the plurality of trenches.

18. The apparatus of claim 17, wherein each of the chips further comprises a first region including the plurality of trenches and a second region including the TDV region, wherein an area of the first region is smaller than an area of the second region.

19. The apparatus of claim 17, wherein the stacked chip package is a memory device, and wherein each of the plurality of chips includes a memory cell region including a plurality of memory cells and a peripheral region including the peripheral TDV region and the plurality of trenches.

20. The apparatus of claim 17, wherein the peripheral TDV region and the plurality of trenches are formed from a film, and wherein the TDV extends through the film.

21. The apparatus of claim 17, further comprising a plurality of transistors disposed in the plurality of trenches.

* * * * *